United States Patent
Xue et al.

(10) Patent No.: US 9,147,648 B2
(45) Date of Patent: Sep. 29, 2015

(54) MULTI-DIE POWER SEMICONDUCTOR DEVICE PACKAGED ON A LEAD FRAME UNIT WITH MULTIPLE CARRIER PINS AND A METAL CLIP

(71) Applicant: Alpha and Omega Semiconductor Incorporated, Sunnyvale, CA (US)

(72) Inventors: Yan Xun Xue, Los Gatos, CA (US); Hamza Yilmaz, Saratoga, CA (US)

(73) Assignee: Alpha & Omega Semiconductor, Inc., Sunnyvale, CA (US)

( * ) Notice: Subject to any disclaimer, the term of this patent is extended or adjusted under 35 U.S.C. 154(b) by 0 days.

(21) Appl. No.: 14/548,632

(22) Filed: Nov. 20, 2014

(65) Prior Publication Data

US 2015/0069590 A1 Mar. 12, 2015

Related U.S. Application Data

(62) Division of application No. 13/913,717, filed on Jun. 10, 2013, now Pat. No. 8,981,539.

(51) Int. Cl.
*H01L 23/495* (2006.01)
*H01L 23/34* (2006.01)
*H01L 23/48* (2006.01)
*H01L 23/52* (2006.01)
*H01L 23/02* (2006.01)
*H01L 23/04* (2006.01)
*H01L 23/492* (2006.01)
*H01L 23/00* (2006.01)
*H01L 25/07* (2006.01)

(52) U.S. Cl.
CPC ........ *H01L 23/49568* (2013.01); *H01L 23/492* (2013.01); *H01L 23/49503* (2013.01); *H01L 23/49541* (2013.01); *H01L 23/49548* (2013.01); *H01L 23/49562* (2013.01); *H01L 23/49575* (2013.01); *H01L 24/17* (2013.01); *H01L 24/34* (2013.01); *H01L 24/49* (2013.01); *H01L 25/072* (2013.01); *H01L 2224/16245* (2013.01); *H01L 2224/48245* (2013.01); *H01L 2224/48247* (2013.01); *H01L 2224/49173* (2013.01); *H01L 2924/13091* (2013.01)

(58) Field of Classification Search
CPC .......... H01L 2224/48091; H01L 2224/48247; H01L 2924/01079; H01L 2924/14; H01L 2924/01029; H01L 2924/3011
USPC ......... 257/676, 672, 673, 674, 690, 691, 692, 257/693, 723, 730, 731, 685
See application file for complete search history.

(56) References Cited

U.S. PATENT DOCUMENTS

| | | | |
|---|---|---|---|
| 6,528,868 B1 * | 3/2003 | Weiblen et al. | 257/669 |
| 2010/0127366 A1 * | 5/2010 | Bond et al. | 257/676 |
| 2012/0038033 A1 * | 2/2012 | Oga et al. | 257/659 |
| 2012/0049337 A1 * | 3/2012 | Uno et al. | 257/676 |

* cited by examiner

*Primary Examiner* — A. Sefer
*Assistant Examiner* — Dilinh Nguyen
(74) *Attorney, Agent, or Firm* — Chein-Hwa S. Tsao

(57) ABSTRACT

A power semiconductor device comprises a lead frame unit, a control die, a first MOSFET die and a second MOSFET die, wherein the lead frame unit comprises at least a die paddle for mounting the first and second MOSFET dies, a first pin and a second pin for connecting to top electrodes of the first and second MOSFET dies, a first row of carrier pins and a second row of carrier pins disposed in-line with the first and second pins respectively for the control die to mount thereon.

13 Claims, 17 Drawing Sheets

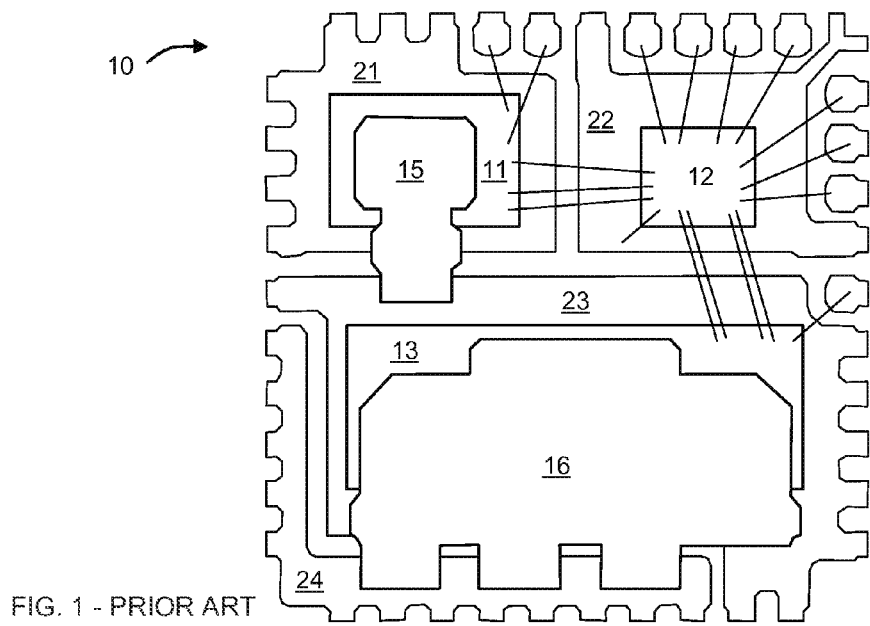
FIG. 1 - PRIOR ART
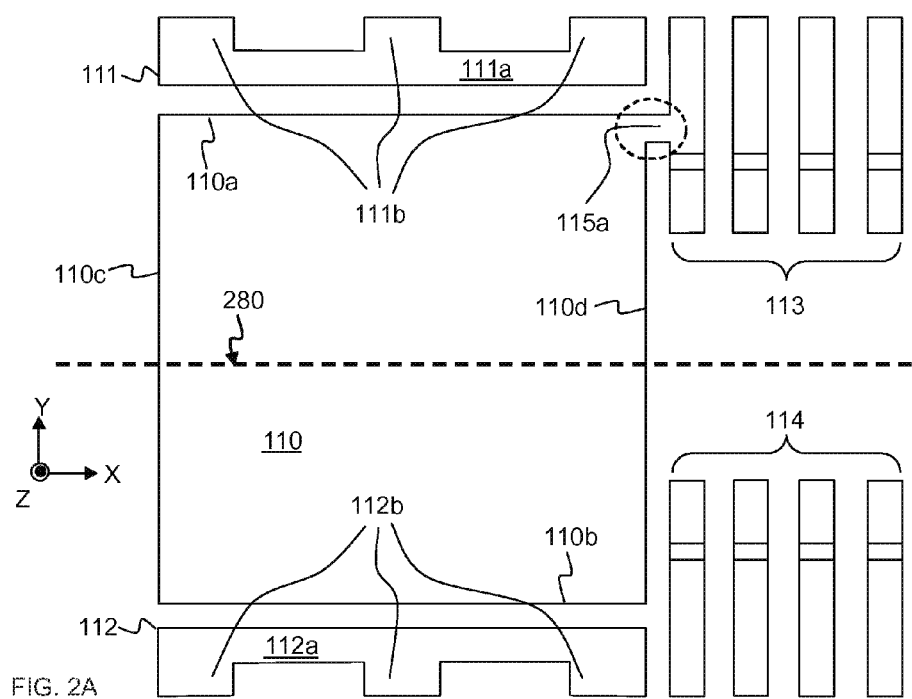
FIG. 2A

MULTI-DIE POWER SEMICONDUCTOR DEVICE PACKAGED ON A LEAD FRAME UNIT WITH MULTIPLE CARRIER PINS AND A METAL CLIP

This Patent Application is a Divisional (DIV) Application, thus claiming the priority, of a co-pending application Ser. No. 13/913,717 filed on Jun. 10, 2013 by a common inventor of this Application. The Disclosure made in the patent application Ser. No. 13/913,717 is hereby incorporated by reference.

FIELD OF THE INVENTION

The invention generally relates to a power management device, particularly relating to a power control device including a high-side MOSFET, a low-side MOSFET (Metal-Oxide-Semiconductor Field Effect Transistor) and a control integrated circuit (IC) and a preparation method thereof.

DESCRIPTION OF THE RELATED ART

Due to large power consumption of semiconductor chips in a power control device such as a DC-DC application, the source electrode or the drain electrode of the semiconductor power chip often needs to have good heat dissipation; thus, part of lead frame is exposed from a plastic package body to improve the thermal performance. For example, as shown in FIG. 1, a DC-DC converter 10 includes a high-side MOSFET 11, a low-side MOSFET 13 and a control IC 12, where the control IC 12 outputs a PWN or PFM signal to MOSFET 11 and MOSFET 13 and receives feedback signals thereof; therefore, some electrode pads of the MOSFET 11 and the MOSFET 13 is electrically connected to I/O pad of the control IC 12 through a plurality of bonding wires. The MOSFET 11 and the MOSFET 13 are respectively attached on a die paddle 21 and a die paddle 23 separated from each other, where the source of the MOSFET 11 is connected to the paddle 23 through a metal clip 15 and the source of the MOSFET 13 is connected with a pin 24 through a metal clip 16, while the control IC 12 is attached on separate die paddle 22. The bottom surface of the die paddle 21 and the die paddle 23 are exposed from the plastic package body (not shown) as a terminal for electrical contact with an external circuit and for heat dissipation. The die paddle 21, the die paddle 22 and the die paddle 23 take large areas, which lead to expensive cost and device big size. US patent publication US2012061813A1 discloses a DC-DC converter, in which the high-side MOSFET and low-side MOSFET are located on two separate die paddles arranged side by side. However, the low-side MOSFET is completely overlapped on the high-side MOSFET and the control device; thus, the height of the bonding wire connecting the high-side MOSFET and the control device must be well controlled to avoid the contact between the bonding wire and the low-side MOSFET. In addition, the heat dissipation of the high-side MOSFET and the low-side MOSFET of this device is poor.

It is within this context that embodiments of the present invention arise.

BRIEF DESCRIPTION OF THE DRAWINGS

As shown in attached drawing, the embodiment of the invention is more sufficiently described. However, the attached drawings are only used for explaining and illustrating rather than limiting the range of the invention.

FIG. 1 is a top view structure of the conventional DC-DC converter 10.

FIGS. 2A-2H are schematic diagrams illustrating a process forming the power control device of the present invention.

DETAILED DESCRIPTION OF THE PREFERRED EMBODIMENTS

Figure 2B:
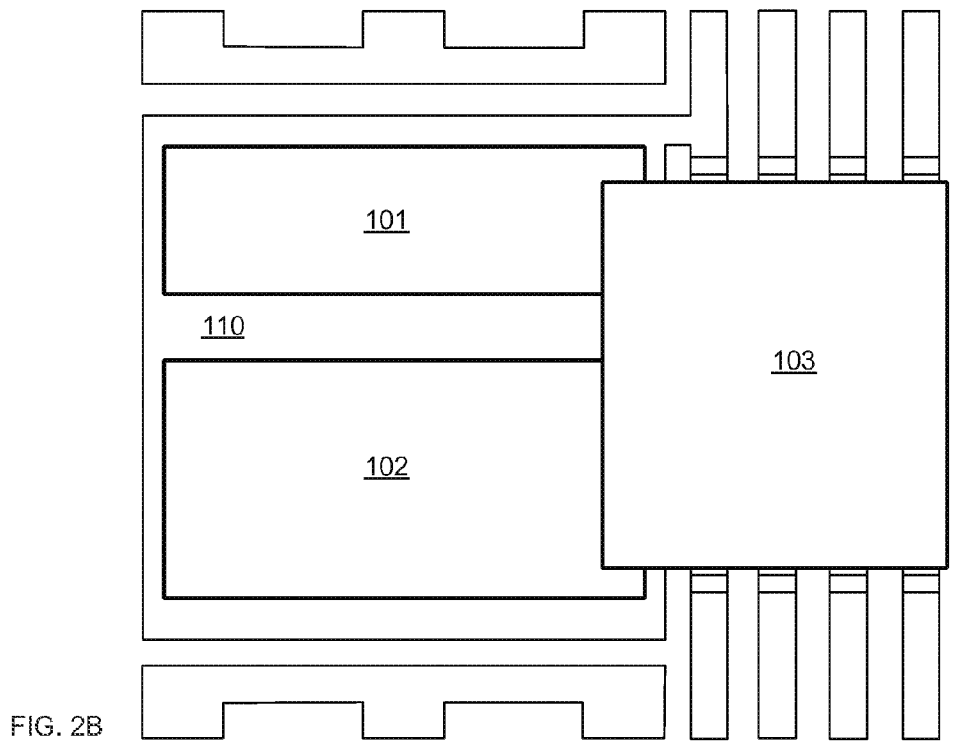

FIG. 2A is a top view of a lead frame unit comprising a die paddle 110 in a rectangular shape regularly and a first pin 111 and a second pin 112, a first row of carrier pins 113 and a second row of carrier pins 114. For the convenience to describe the position of the components of the lead frame unit, an X-Y-Z Cartesian coordinate system is defined in FIG. 2A. The die paddle 110 includes a first transverse edge 110a and a second transverse edge 110b opposite to each other, and a first longitudinal edge 110c and a second longitudinal edge 110d opposite to each other. The first pin 111 includes a strip-type bonding area 111a adjacent and extending along the first transverse edge 110a and external pins 111b perpendicular to the bonding area 111a and extending along the direction away from the die paddle 110. The second pin 112 includes a strip-type bonding area 112a adjacent and extending along the second transverse edge 110b and external pins 112b perpendicular to the bonding area 112a and extending along the direction away from the die paddle 110.

Each of the first row of carrier pins 113 and second row of carrier pins 114 includes a plurality of carrier pins arranged in parallel to each other with a distance between two adjacent pins either equal or unequal. The first row of the carrier pins 113 and the second row of the carrier pins 114 are positioned at the same side of and parallel to the second longitudinal edge 110d of the die paddle 110, where the carrier pins of the first row of carrier pins 113 extend in Y direction from an extension of the first pin 111 towards a center line 280 between the first transverse edge 110a and the second transverse edge 110b, and the carrier pins in the second row of carrier pins 114 extend from an extension of the second pin 112 towards the center line 280. The die paddle 110 also includes a connecting part 115a at the corner of the first transverse edge 110a and the second longitudinal edge 110d for connecting the die paddle 110 to the innermost carrier pin of the first row of carrier pins 113 closest to the second longitudinal edge 110d.

As shown in FIG. 2B, a first die 101 and a second die 102 are firstly attached on the top surface of the die paddle 110 side by side, where the first die 101 is close to the first transverse edge 110a and the second die 102 is close to the second transverse edge 110b. A control die 103 is flipped and attached on the first row of carrier pins 113 and the second row of carrier pins 114 and partially overlaps on side portions of the first die 101 and the second die 102 close to the second longitudinal edge 110d.

Figure 2C:
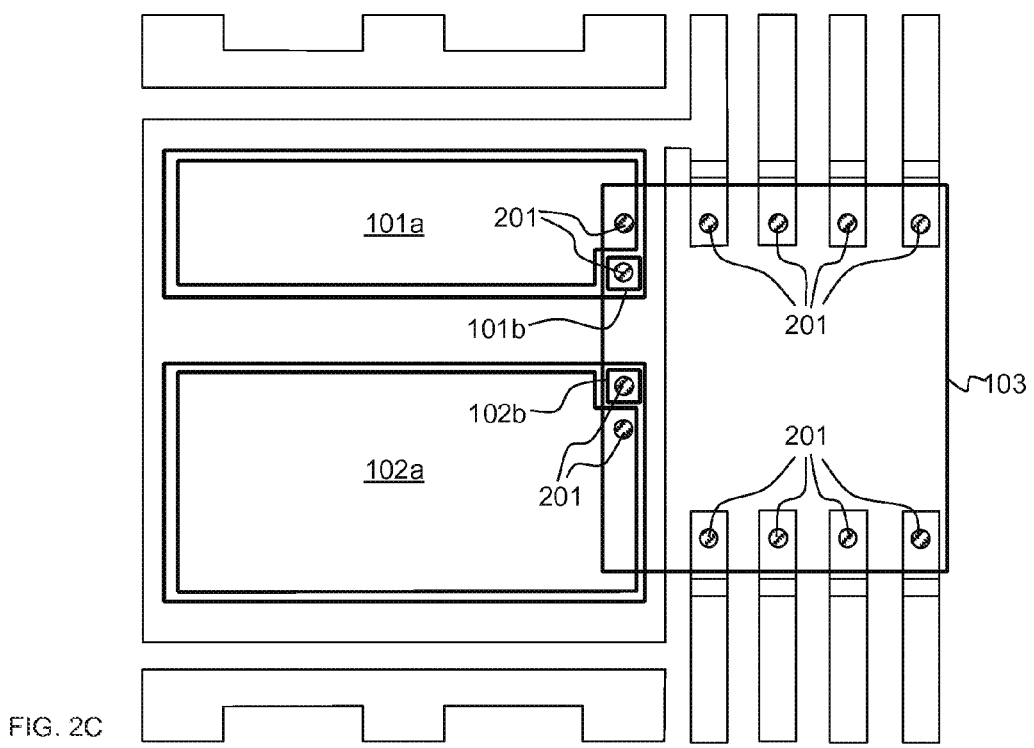

As shown in FIG. 2C, the first die 101 is a high-side P-type channel MOSFET, the second die 102 is a low-side N-type channel MOSFET. A first electrode 101a, for example a source electrode, and a second electrode 101b, for example a gate electrode, are arranged at the front surface of the first die 101, and a third electrode, for example a drain electrode, is formed by a metal layer at the back surface of the first die 101 (not shown), where the third electrode is attached on the top surface of the die paddle 110 through a conductive adhesive. Similarly, a first electrode 102a, for example a source electrode, and a second electrode 102b, for example a gate electrode, are arranged at the front surface of the second die 102, and a third electrode, for example a drain electrode, is formed by a metal layer at the back surface of the second die 102a (not shown), where the third electrode is attached on the top surface of the die paddle 110 through a conductive adhesive.

Figure 2D:
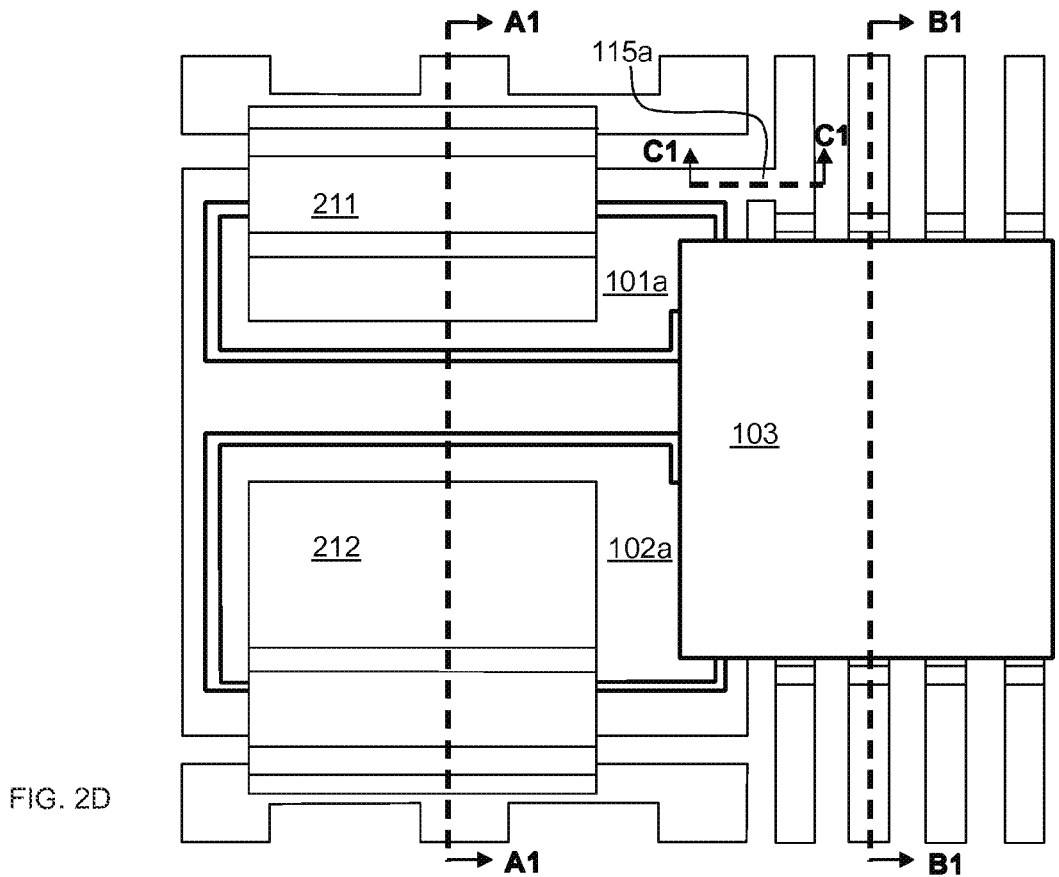
Figure 2E:
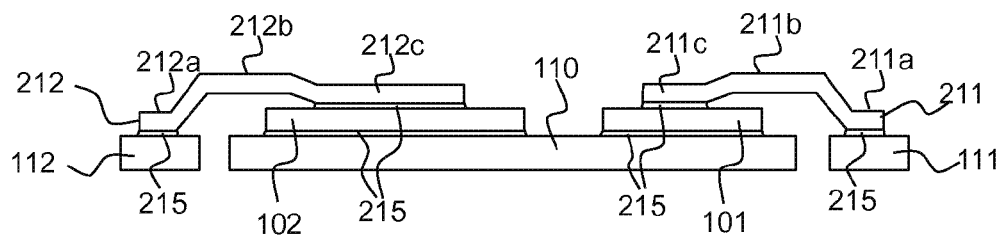
Figure 2F:
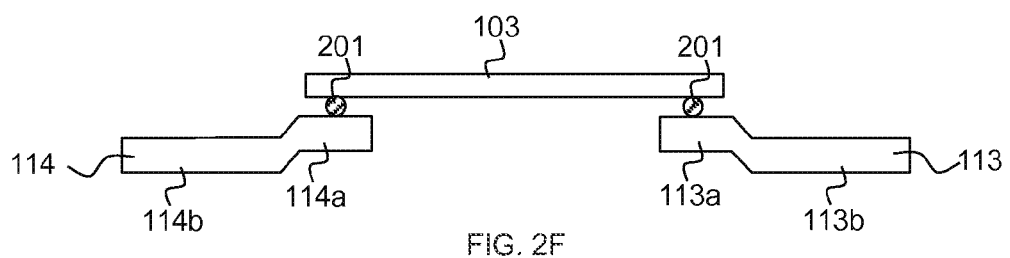

FIG. 2F is a cross sectional schematic diagram along the line B1-B1 in FIG. 2D. As shown in FIG. 2F, each carrier pin of the first row of carrier pins 113 comprises an upper pin 113a and a lower pin 113b connected together with the plane of upper pin 113a higher than the plane of the lower pin 113b. Similarly, each carrier pin of the second row of carrier pins 114 comprises an upper pin 114a and a lower pin 114b. The top surfaces of the upper pins 113a and 114a need to be coplanar with the respective front surface of the first die 101 and the second die 102.

Figure 6A:
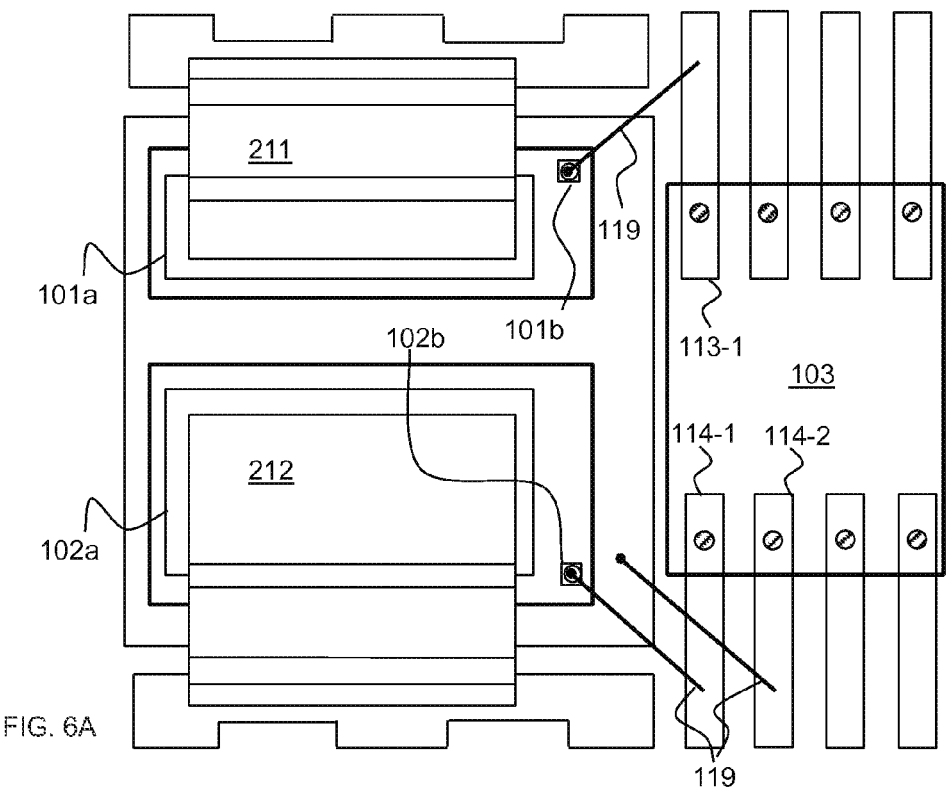
FIG. 6A is a schematic diagram of the power control device comprising flipped control die and bonding wires.
Figure 6B:
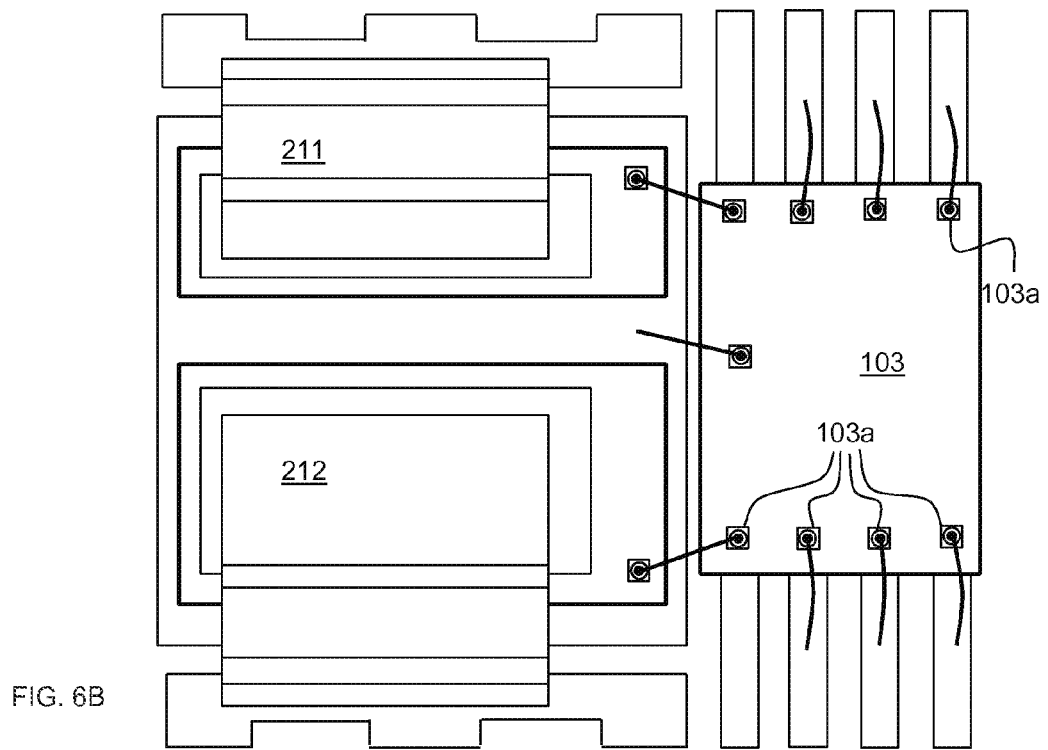
FIG. 6B is a schematic diagram of the power control device comprising non-flipped control die and bonding wires.

For the sake of the clarity, the control die 103 is drawn transparently in FIG. 2C, with a metal bump 201 deposited on each electrode pad, similar as the electrode pad 103a shown in FIG. 6B, formed at the front surface of the control die 103. The metal bumps can be solder ball and the likes. The metal bumps 201 arranged on the electrode pads close to the edges of two opposite sides of the control die are aligned with and attached onto the corresponding upper pins 113a and 114a respectively. The control die 103 is further mounted to partially overlap on side portions of the first die 101 and the second die 102, where metal bumps 201 deposited on the electrode pads at the front surface of the control die 103 closed to the edge overlapping with the first die 101 and the second die 102 are aligned with and electrically connected with the first electrode 101a of the first die 101 and the first electrode 102a of the second die 102 respectively. As an option, the second electrodes 101b and 102b of the first and second dies 101 and 102 may be aligned and connected to additional electrode pads of control die 103 through metal bumps 201. As described above, the top surfaces of the upper pins 113a and 114a and the respective front surfaces of the first die 101 and the second die 102 are coplanar, as such the control die 103 is attached onto the upper pins 113a and 114a and the respective front surfaces of the first die 101 and the second die 102 horizontally without slanting, which avoids poor soldering joints of the metal bumps.

Figure 2G:
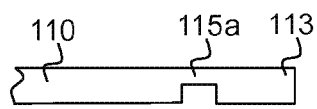

As shown in FIG. 2D, a first metal clip 211 is mounted on the front surface of the first die 101 and the bonding area 111a of the first pin 111 via an adhesive, and a second metal clip 212 is mounted on the front surface of the second die 102 and the bonding area 112a of the second pin 112. FIG. 2E is a cross sectional schematic diagram along the line A1-A1 in FIG. 2D. As shown in FIG. 2E, the first die 101 and the second die 102 are attached on the die paddle 110 through a conductive adhesive 215. The first metal clip 211 and the second metal clip 212 are bridge-type clips able to attach on the dies and the pins located on the planes with different heights. The first metal clip 211 comprises a first part 211b (bridge part), a second and a third parts 211a and 211c (valley parts) connected at two sides of the first part 211b. The first part 211b, the second part 211a and the third part 211c locate on three planes with different heights compared to the plane of the lead frame unit, where the first part 211b is highest and the second part 211a is lowest. The second part 211a is attached on the top surface of the bonding area 111a of the first pin 111, and the third part 211c is attached on the first electrode 101a of the first die 101 via an adhesive. Similarly, the second metal clip 212 also comprises a first part 212b and a second and a third parts 212a and 212c connected at two sides of the first part 212b respectively. The second part 212a is attached on the top surface of the bonding area 112a of the second pin 112, and the third part 212c is attached on the first electrode 102a of the second die 102. FIG. 2G is a cross sectional schematic diagram along the line C1-C1 in FIG. 2D showing the structure of the connecting part 115a positioned at the second longitudinal edge 110d close to the first row of carrier pins 113 for connecting the die paddle 110 to the innermost carrier pin 113-1 with the connecting part 115a is thinner than the die paddle 110 and the carrier pins 113.

Figure 2H:
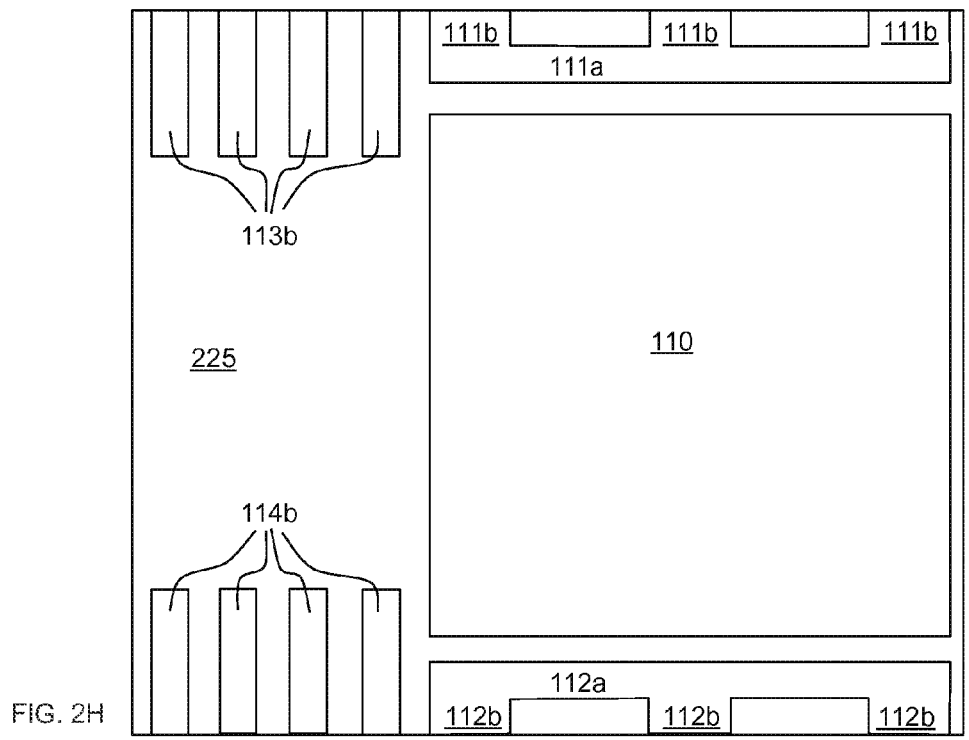

As shown in FIG. 2H, which shows a bottom view of the power control device, plastic package materials, such as epoxy resin and the like, is deposited to form a plastic package body 225 for encapsulating the lead frame unit, the first die 101 and the second die 102, the control die 103, the first metal clip 211 and the second metal clip 201 and the metal bumps 201, where the bottom surface of the lower pins 113b and 114b, the bottom surface of the die paddle 110, and the respective bottom surface of the first pin 111 and the second pin 112 are exposed from the bottom surface of the plastic package body 225. In this embodiment, the top surface of the first die 101, the second die 102, the control die 103, the first metal clip 211, the second metal clip 212, and the metal bumps 201 are all completely encapsulated by the plastic package body 225 (not shown).

As shown in FIGS. 2G-2H, the connecting part 115a between the die paddle 110 and the carrier pin 113-1 is thinner than the die paddle 110 and the carrier pin 113-1, as such the connecting part 115 is also completely encapsulated inside the plastic package body 225. Alternatively, the connecting part 115a can have the same thickness as the die paddle 110 and the carrier pin 113-1, thus the bottom surface of the connecting part 115a can be exposed from the bottom surface of the plastic package body 225 (not shown).

Figure 3A:
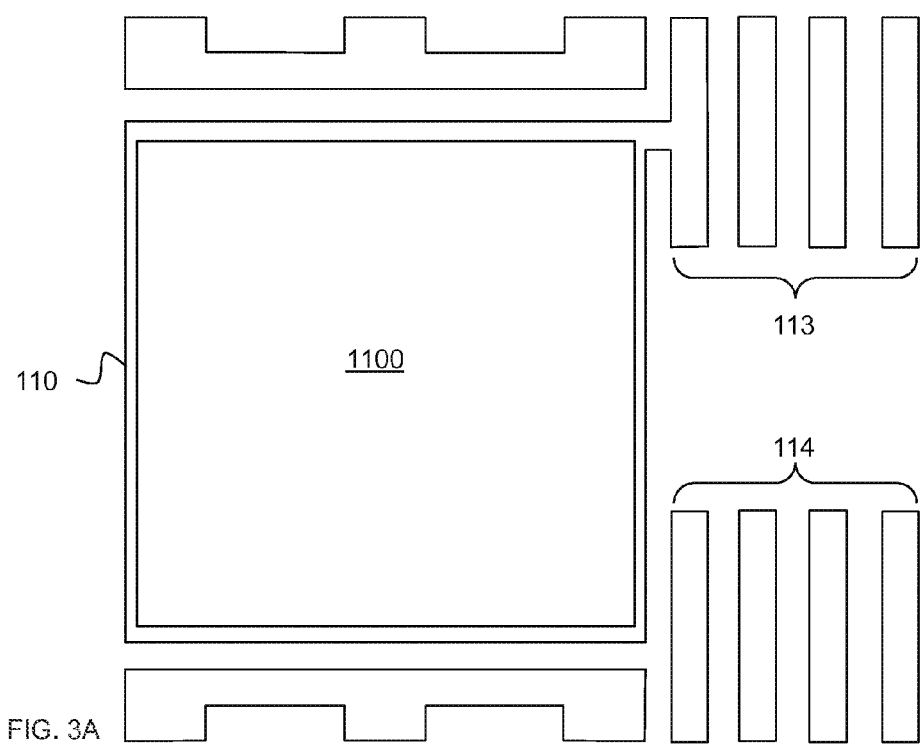
FIGS. 3A-3E are schematic diagrams illustrating a process forming the power control device with a recessed area formed on the die paddle.

FIG. 3A is a top view of an alternative lead frame unit according to another embodiment of the present invention.

Figure 3B:
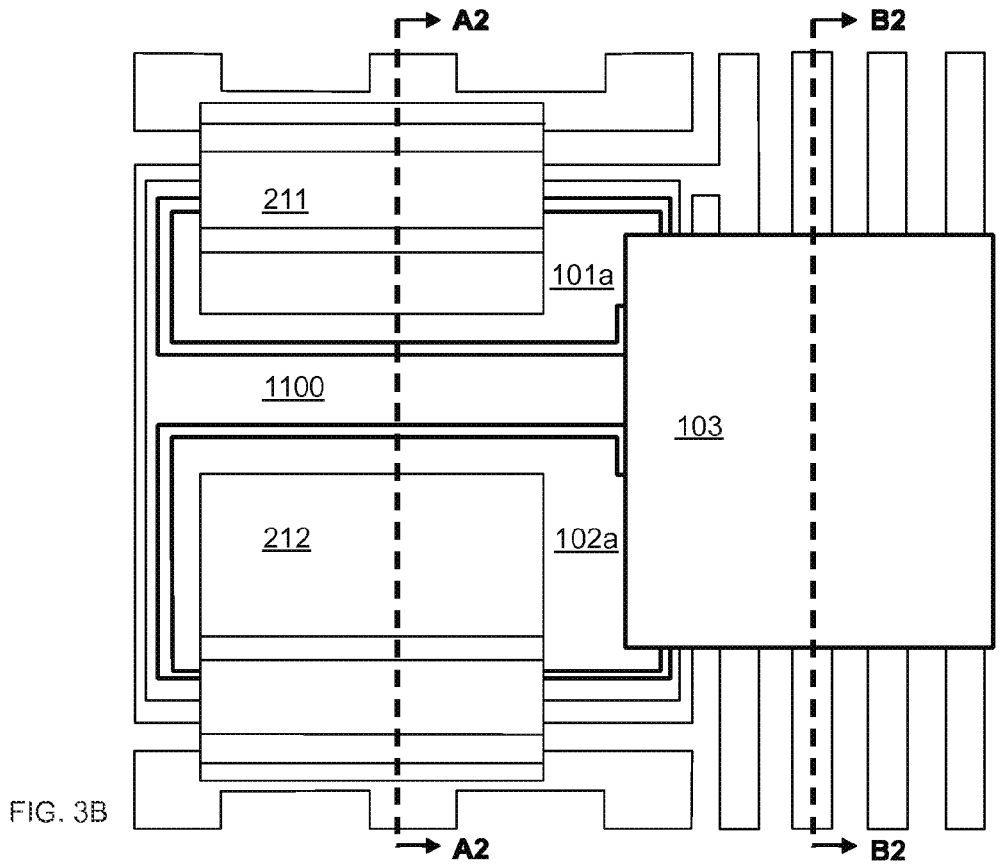
Figure 3C:
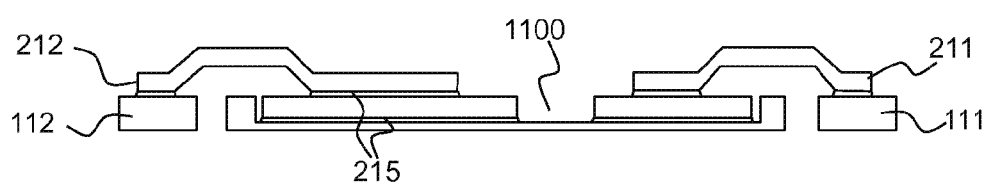
Figure 3D:
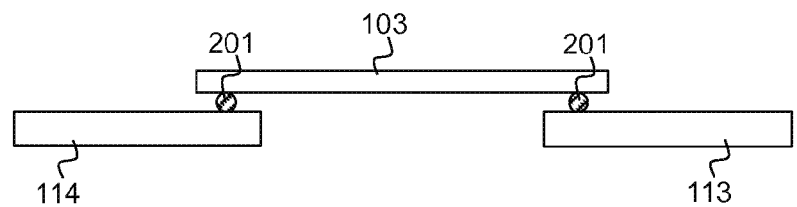
Figure 3E:
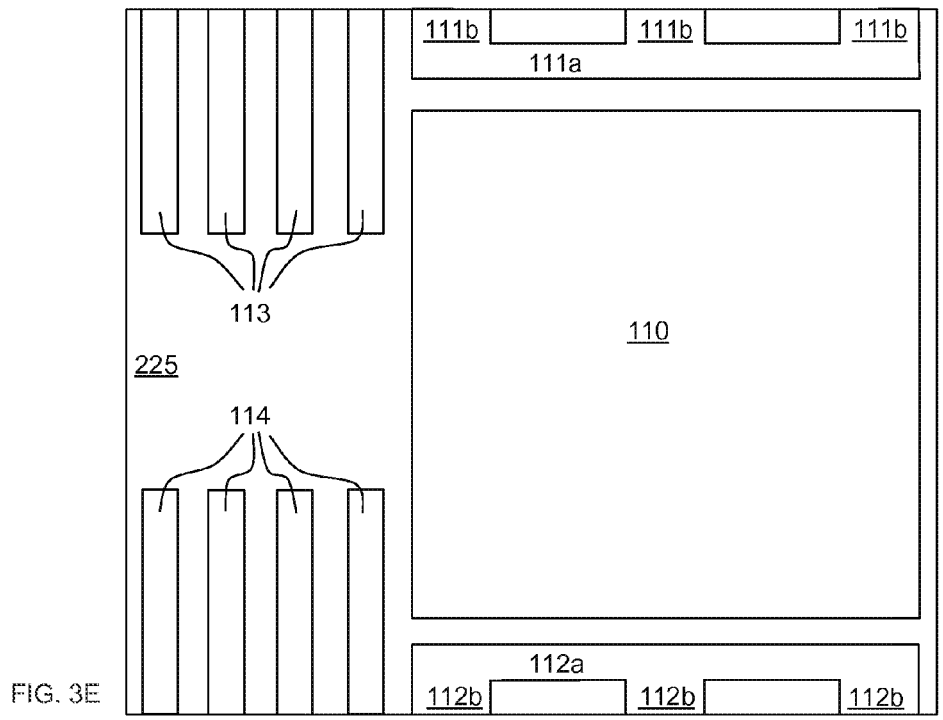

The die paddle shown in FIG. 3A is similar with that shown in FIG. 2A except that a recessed area 1100 roughly in rectangular shape is formed on the top surface of the die paddle 110 by etching or stamping and each carrier pin of the first row of carrier pins 113 and the second row of carrier pins 114 is of a strip-type structure. The depth of the recessed area 1100 can be adjusted, so that the front surfaces of the first die 101, the second die 102, after attached on the recessed area 1100 of the die paddle 110, and each carrier pin of the first row of carrier pins 113 and the second row of carrier pins 114 are coplanar as shown in FIG. 3C that is a cross sectional schematic diagram along the line A2-A2 in FIG. 3B. In this embodiment, as shown in FIG. 3D that is a cross section schematic diagram along line B2-B2 in FIG. 3B, the control die 103 is flipped and mounted on the first row of carrier pins 113 and the second row of carrier pins 114 and partially overlapped with side portions of the first die 102 and the second die 103, where some metal bumps 201 formed on electrode pads positioned close to two opposite edges at the front surface of the control die 103 is aligned with and electrically connected with the first electrode 101a and the second electrode 101b at the front surface of the first die 103 and the first electrode 102a and the second electrode 102b at the front surface of the second die 102, while the remaining of the metal bumps 201 of the control die 103 are aligned with and electrically connected with each carrier pin of the first row of carrier pins 113 and the second row of the carrier pins 114. As shown in FIG. 3C, both the first die 101 and the second die 102 are attached on the recessed area 1100 of the die paddle 110 via an adhesive 215. In this embodiment, as shown in FIG. 3E that is a bottom view of the device package, the bottom surface of each carrier pin of the first row of carrier pins 113 and the second row of carrier pins 114 is exposed from the bottom surface of the plastic package body 225, while the first die 101 and the second die 102, the control die 103, the first metal clip 211 and the second metal clip 212 and the metal bumps 225 are completely encapsulated inside the plastic package body 225 (not shown).

Figure 4A:
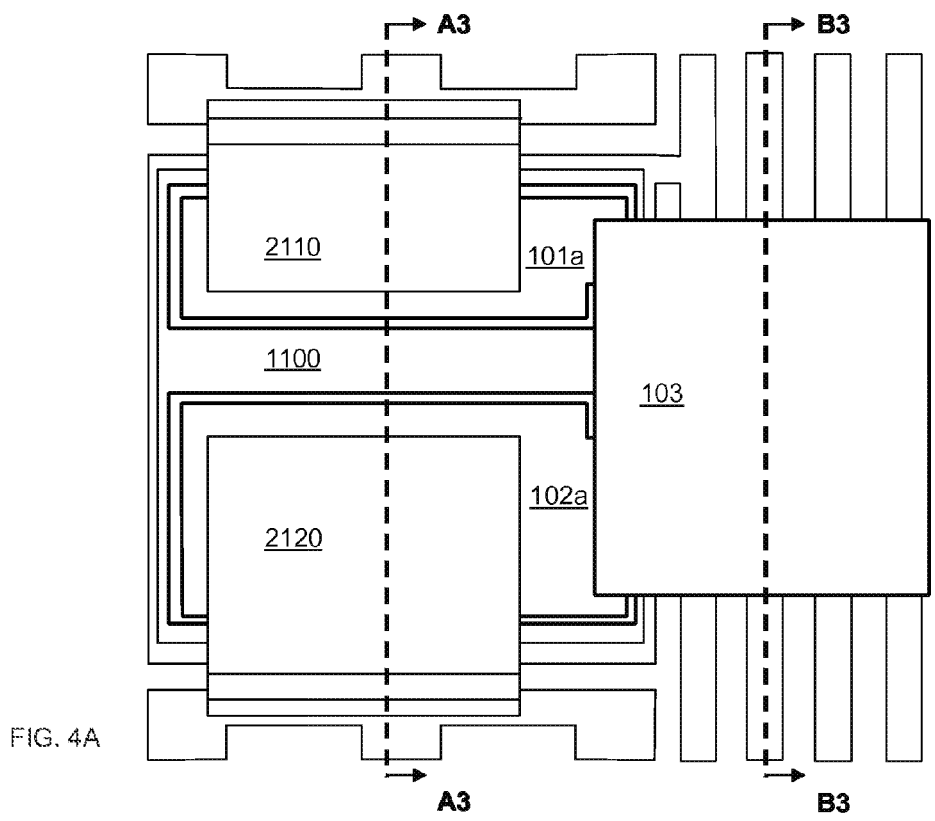
FIGS. 4A-4C are schematic diagrams illustrating a process forming the power control device with a recessed area formed on the die paddle and the back surface of the metal clip exposed from the top surface of the plastic package body.
Figure 4B:
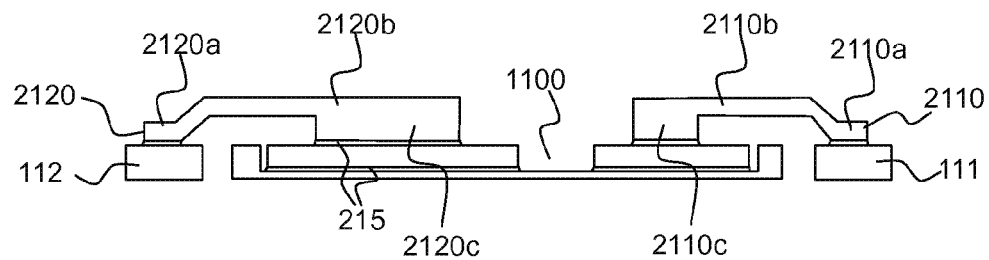
Figure 4C:
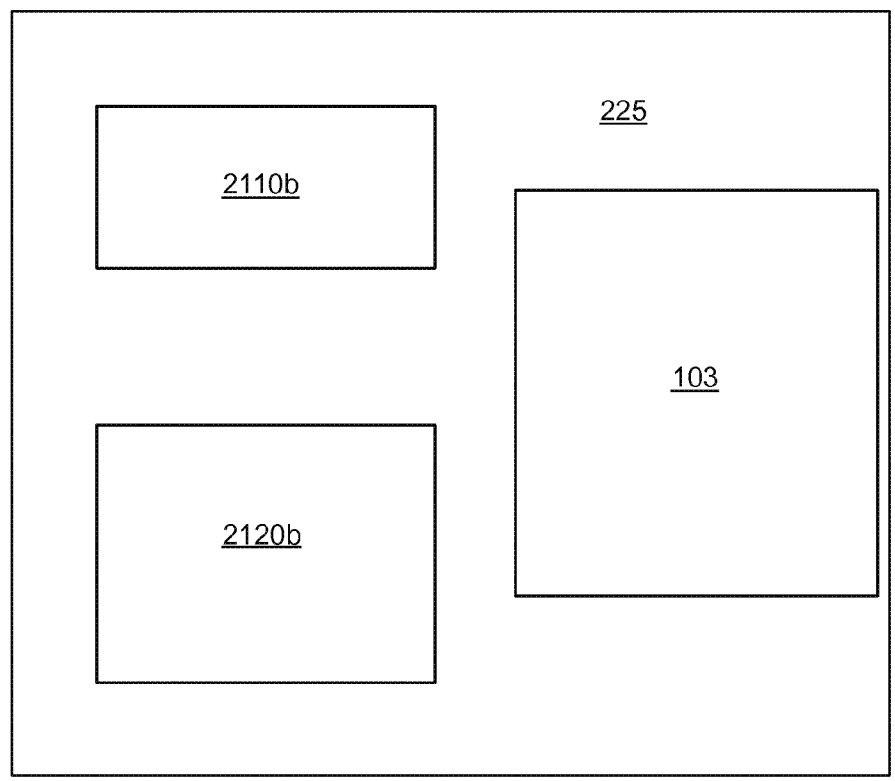

In another embodiment as shown in FIG. 4A, a first metal clip 2110 and a second metal clip 2120 are not a bridge-type clip. As shown in FIG. 4B, which is a cross sectional schematic diagram along the line A3-A3 in FIG. 4A, the first metal clip 2110 comprises a first part 2110b and a second part 2110a connected at one side of the first part 2110b, where the plane of the first part 2110b is higher than that of the second part 2110a, and a third part 2110c connected at the other side of the first part 2110b, extending downward and attached on the first electrode 101a of the first die 101, while the second part 2110a is attached on the bonding area 111a of the first pin 111 by the adhesive 215. The second metal clip 2120 comprises a first part 2120b and a second part 2120a connected at one side of the first part 2120b and a third part 2120c connected at the other side of the first part 2120b, extending downward and attached on the first electrode 102a of the second die 102 while the second part 2120a is attached on the bonding area 112a of the second pin 112 by the adhesive 215. Due to the factors of preparation technology, for example punching or stamping, the first part 211b (or 212b) of the first bridge metal clip 211 (or the second bridge metal clip 212) shown in FIG. 3B is not completely flat, the top surface of the first part 211b (or 212b) cannot be exposed from the plastic package body 225; thus, the first metal clip 211 (or the second metal clip 212) is often encapsulated by the plastic package body 225. In this embodiment, the top surfaces of the first part 2110b and the first part 2120b of the first and second metal clips 2110 and 2120 respectively are completely flat so they can be exposed from the top surface of the plastic package body 225 as shown in FIG. 4C that is a top view of the device package. Alternatively, if the top surfaces of the first parts 211b and 212b of the metal clips 211 and 212 are absolutely flat surfaces, the first parts 211b and 212b can also be exposed from the top surface of the plastic package body 225. The cross section along the line B3-B3 in FIG. 4A is the same as that in FIG. 3D, so that the back surfaces of the flipped control die 103 and the respective top surface of the first part 2110b and the first part 2120b can be coplanar; thus, the back surfaces of the flipped control die 103 can also be exposed from the top surface of the plastic package body 225 for further improvement of the heat dissipation of the power device. In this embodiment, the bottom surface of each carrier pin of the first row of carrier pins 113 and the second row of carrier pins 114, the bottom surface of the die paddle 110, and the respective bottom surface of the first pin 111 and the second pin 112 are exposed from the bottom surface of the plastic package body 225, which is similar as that shown in FIG. 3E. Alternatively, the first metal clip 2110, the second metal clip 2120 and the control die 103 can also be completely covered by the plastic package body 225.

Figure 5A:
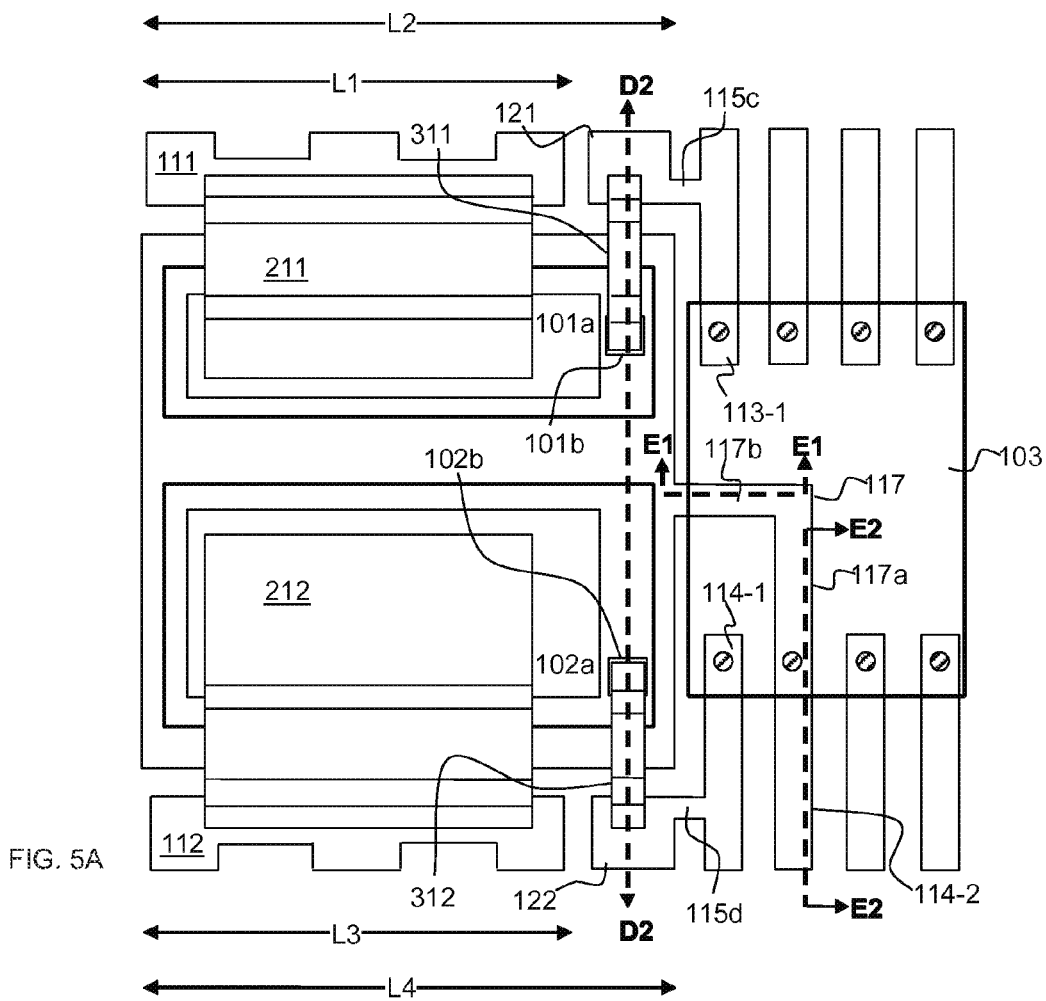
FIGS. 5A-5D are schematic diagrams illustrating a process forming the power control device with a lead frame unit comprising a bypass pin.
Figure 5B:
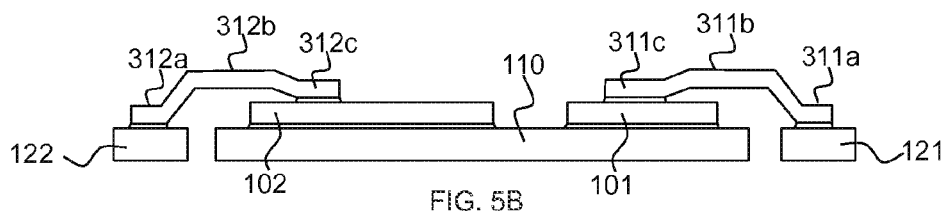
Figure 5C:
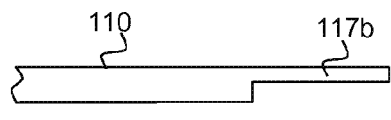
Figure 5D:
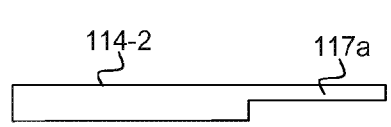

In an embodiment as shown in FIG. 5A, the length L1 of the first pin 111 extending along the first transverse edge 110a is less than the length L2 of the first transverse edge 110a and the length L3 of the second pin 112 extending along the second transverse edge 110b is less than the length L4 of the second transverse edge 110b, thus the lead frame unit also includes a first bypass pin 121 and a second bypass pin 122. The first bypass pin 121 is positioned side by side with the first pin 111, close to the first transverse edge 110a and between the innermost carrier pin 113-1 of the first row of carrier pins 113 and the first pin 111 and is connected with the innermost carrier pin 113-1 by a connecting part 115c with the thickness of the connecting part 115c less than or the same with that of the first bypass pin 121 and the carrier pin 113-1. Similarly, the second bypass pin 122 is positioned side by side with the first pin 112, close to the second transverse edge 110b and between an innermost carrier pin 114-1 of the second row of carrier pins 114 and the second pin 112 and is connected with the innermost carrier pin 114-1 by a connecting part 115d with the thickness of the connecting part 115d either less than or the same as that of the second bypass pin 122 and the carrier pin 114-1. In FIG. 5A, the third electrodes of the first die 101 and the second die 102 at the back surfaces are attached on the top surface of the die paddle 110. The first electrode 101a of the first die 101 is electrically connected with the first pin 111 through the first metal clip 211, and the first electrode 102a of the second die 102 is electrically connected with the second pin 112 through the second metal clip 212. The control die 103 is flipped and attached on the first row of carrier pins 113 and the second row of carrier pins 114. In this embodiment, the control die 103 does not overlaps with the first die 101 and the second die 102 and the metal bumps 201 deposited on electrode pads at the front surface and close to two opposite edges of the control die 103 are aligned with and electrically connected to the carrier pins of the first row of carrier pins 113 of the second row of carrier pins 114 respectively. In FIG. 5A, the die paddle is mechanically and electrically connected with any carrier pin of the first row of carrier pins 113 or second row of carrier pins 114 excepting the innermost carrier pin 113-1 or 114-1 by an L-shaped connecting structure 117, for example the carrier pin 114-2 positioned adjacent to the innermost carrier pin 114-1 in the second row of carrier pins 114. The connecting structure 117 comprises a transversely section 117b and a longitudinal section 117a connected together and positioned in the same plane. As shown in FIGS. 5C-5D, which is cross sectional schematic diagrams along lines E1-E1 and E2-E2 of FIG. 5A respectively, one end of the transversely section 117*b* is connected with the second longitudinal edge 110*d* of the die paddle 110 and one end of the longitudinal section 117*a* is connected with the carrier pin 114-2. The connecting structure 117 is usually thinner than the die paddle 110 and the carrier pin 114-2, as shown in FIGS. 5C-5D, thus the connecting structure 117, after completing the plastic package process, will be encapsulated in the plastic package body 225. Alternatively, the connecting structure 117 may have same thickness as the die paddle 110 and the carrier pin 114-2, thus, the bottom surface of the connecting structure 117 will be exposed from the bottom surface of the plastic package body 225 (not shown).

In this embodiment, the control die 103 is electrically connected with the second electrode 101*b* at the front surface of the first die 101 via the bypass pin 121, which is connected with the innermost pins 113-1 by the connecting parts 115*c*, by a conductive structure 311. Similarly, the control die 103 is electrically connected with the second electrode 102*b* at the front surface of the second die 102 via the bypass pin 122, which is connected with the innermost pins 114-1 via a connecting part 115*d*, by a conductive structure 312. The conductive structures 311 and 312 can be metal clips, conductive bands or bonding wires, and the likes. FIG. 5B is a cross sectional schematic diagram along the line D2-D2 in FIG. 5A. As shown in FIG. 5B, the conductive structures 311 and 312 are bridge metal clips. The bridge clip 311 includes second and third parts 311*a* and 311*c* connected at two sides of the first part 311*b*, where the third part 311*c* is mounted on the second electrode 101*b* at the top surface of the first die 101 and the second part 311*a* is mounted on the top surface of the first bypass pin 121. Similarly, the bridge clip 312 includes second and third parts 312*a* and 312*c* connected at two sides of the first part 312*b*, where the third part 312*c* is mounted on the second electrode 102*b* at the top surface of the second die 102 and the second part 312*a* is mounted on the top surface of the bypass pin 122. After plastic package process, the bottom surfaces of the die paddle 110, the first pin 111 and the second pin 121, the first bypass pin 121 and the second bypass pin 122, and the bottom surface of each carrier pin of the first row of carrier pins 113 and the second row of carrier pins 114 are exposed out of the bottom surface of the plastic package body 225, while the first die 101, the second die 102, the control die 103, the first metal clip 211, the second metal clip 212, the metal bumps 201 and conductive structures 311 and 312 are completely encapsulated inside the plastic package body 225.

In FIG. 6A, the first die 101 and the second die 102 are firstly attached on the top surface of the die paddle 110, where the third electrodes at the respective back surfaces of the first die 101 and the second die 102 are attached on the top surface of the die paddle 110. The control die 103 is flipped and attached on the first row of carrier pins 113 and the second row of carrier pins 114. The first electrode 101*a* of the first die 101 is electrically connected with the first pin 111 through the first metal clip 211 and the first electrode 102*a* of the second die 102 is electrically connected with the second pin 112 through the first metal clip 212. The control die 103 does not overlap the first die 102 and the second die 103 and the metal bumps 201 arranged on certain pads positioned close to two opposite edges of the control die 103 are aligned with and electrically connected with the carrier pins of the first row of carrier pin 113 and the second row of the carrier pins 114 respectively.

The second electrode 101*b* at the front surface of the first die 101 is electrically connected with any carrier pin of the first row of carrier pins 113 with a bonding wire 119, preferably to the innermost carrier pin 113-1 for a shortest length of the bonding wire 119. Similarly, the second electrode 102*b* at the front surface of the second die 102 is electrically connected with any carrier pin of the second row of carrier pins 114. The top surface of the die paddle 110 is electrically connected with any the carrier pin of the second row of carrier pins 114, which is not connected with the second electrode 102*b* of the second die 102, through the bonding wire 119; for example, the second electrode 102*b* is electrically connected with the innermost carrier pin 114-1, thus the die paddle 110 is electrically connected with the carrier pin 114-2 adjacent to the carrier pin 114-1 for a shortest bonding wire 119. After the plastic package process, the bottom surface of the substrate 110, the first pin and the second pin and the bottom surface of each carrier pin of the first row of carrier pins 113 and the second row of carrier pins 114 is exposed from the bottom surface of the plastic package body 225, while the first die 101, the second die 102, the control die 103, the first metal clip 211 and the second metal clip 212, the metal bumps 201 and the bonding wires 119 are completely encapsulated inside the plastic package body 225.

In another embodiment as shown in FIG. 6B, the control die 103 is attached on the first row of carrier pins 113 and the second row of carrier pins 114 without flipping thus the back surface of the control die 103 is attached on the first row of carrier pins 113 and the second row of carrier pins 114. In addition, the control die 103 also does not overlap the first die 102 and the second die 103. The second electrode 101*b* of the first die 101, the second electrode 102*b* of the second die 102 and the top surface of the die paddle 110 are electrically connected with the corresponding electrode pads 103*a*, without a metal bump 201 formed on the electrode pad 103*a*, at the front surface of the control die 103 by a bonding wire 119 respectively. The other pads 103*a*, which are not connected to the second electrodes 101*b* and 102*b* and the die paddle 110, positioned close to two opposite edges of the control die 103 are electrically connected with the top surface of corresponding carrier pins of the first row of carrier pins 113 and the second row of carrier pins 114 respectively. In order to shorten the length of the bonding wire 119, the electrode pads 103*a* connected to the second electrodes 101*b* and 102*b* and the die paddle 110 are preferably positioned close to the edge of the control die 103 that is close to the die paddle 110. After plastic package process, the bottom surfaces of the die paddle 110, the first pin and the second pin and the bottom surface of each carrier pin of the first row of carrier pins 113 and the second row of carrier pins 114 are exposed from the bottom surface of the plastic package body 225, while the first die 101 and the second die 102, the control die 103, the first metal clip 211, the second metal clip 212, and the bonding wires 119 are completely encapsulated inside the plastic package body 225.

In the embodiments shown in FIGS. 5A, 6A and 6B, the first die 101 is a vertical P-type channel MOSFET and the second die 102 is a vertical N-type channel MOSFET. The first electrode 101*a* is a source electrode and the second electrode 101*b* is a gate electrode. The third electrode at the back surface of the first die 101 is a drain electrode formed by a metal layer (not shown). Similarly, the first electrode 102*a* is a source electrode and the second electrode 102*b* is a gate electrode. The third electrode at the back surface of the second die 102 is a drain electrode formed by a metal layer.

Figure 7A:
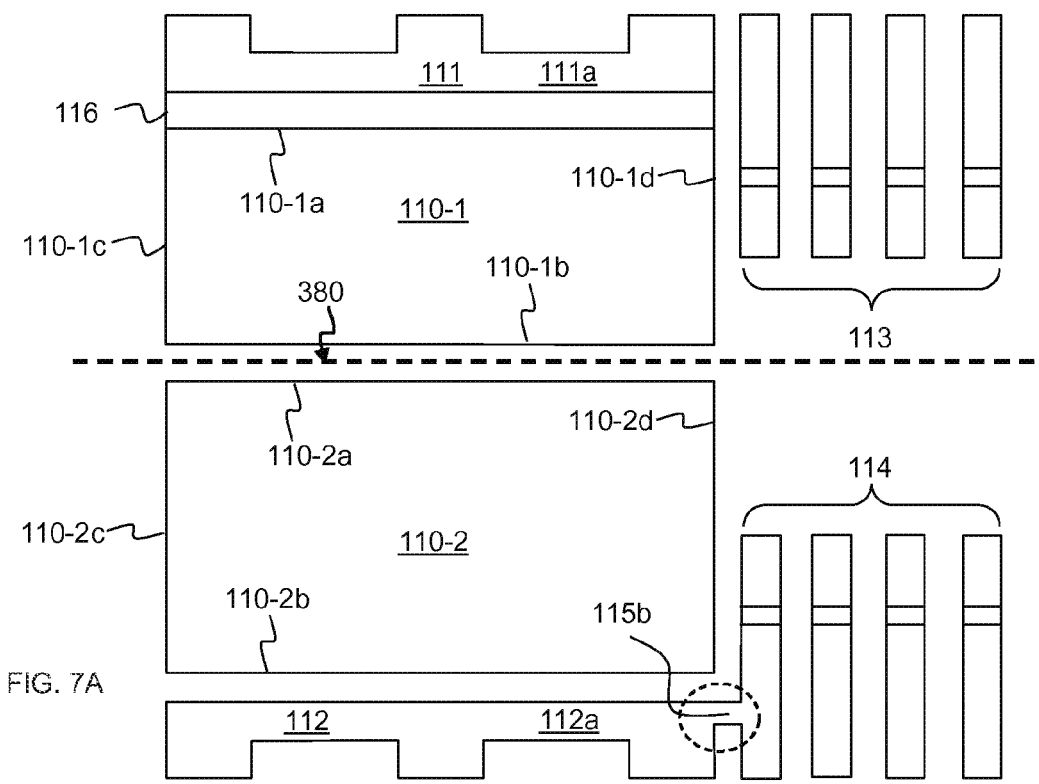
FIGS. 7A-7D are schematic diagrams illustrating a process forming the power control device utilizing two separate die paddles.

In another embodiment, as shown in FIG. 7A, the lead frame unit includes a first die paddle 110-1 and a second die paddle 110-2, for example in rectangular shape, adjacent to each other, where the first pin 111 and the first row of carrier pins 113 are positioned close to the first die paddle 110-1 while the second pin 112 and the second row of carrier pins 114 are positioned close to the second die paddle 110-2. The first die paddle 110-1 includes two opposite first and second transverse edges 110-1a and 110-1b and two opposite first and second longitudinal edges 110-1c and 110-1d. Similarly, the second die paddle 110-2 includes two opposite first and second transverse edges 110-2a and 110-2b and two opposite first and second longitudinal edges 110-2c and 110-2d. The first die paddle 110-1 and the second die paddle 110-2 are arranged side by side with the first transverse edge 110-2a of the second die paddle 110-2 close to the second transverse edge 110-1b of the first die paddle 110-1. Preferably, the second longitudinal edge 110-1d is substantially aligned with the second longitudinal edge 110-2d, and the first longitudinal edge 110-1c is substantially aligned with the second longitudinal edge 110-2c.

Figure 7B:
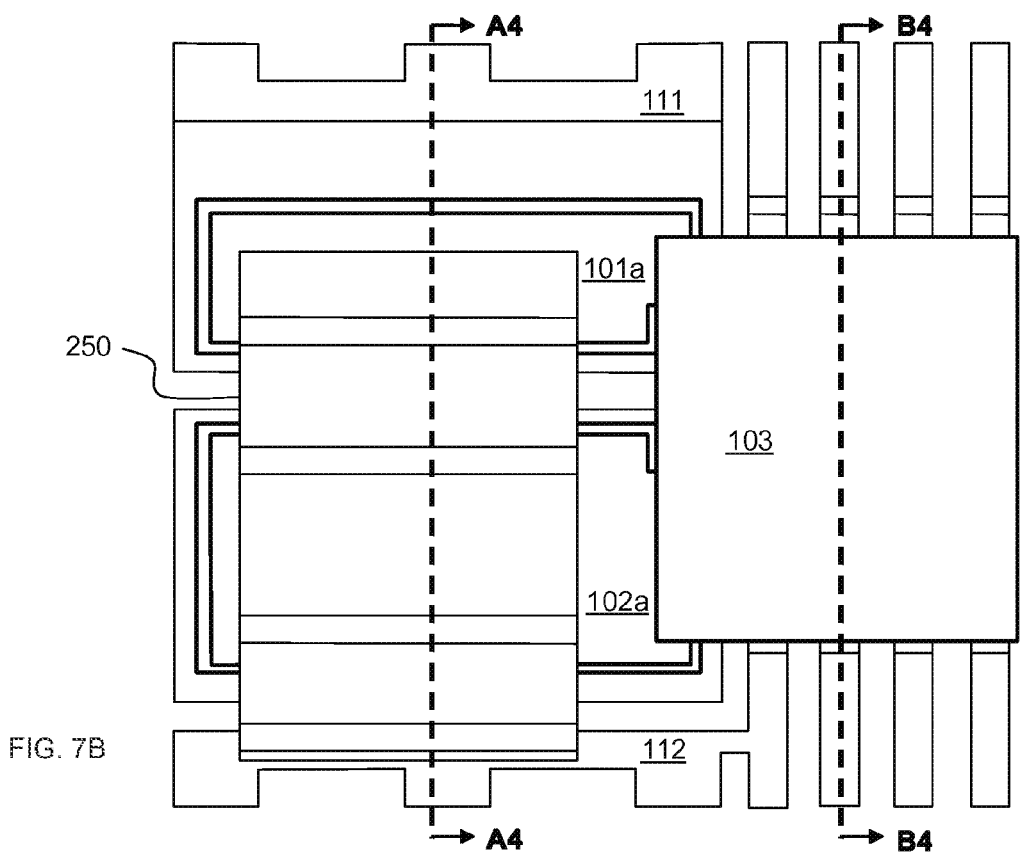
Figure 7C:
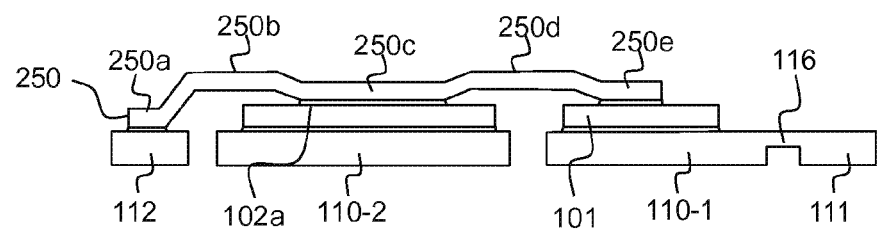

FIG. 7C is a cross sectional schematic diagram along the line A4-A4 in FIG. 7B. Referring to FIGS. 7A, 7B and 7C, the first pin 111 is close to the first transverse edge 110-1a of the first die paddle 110-1, and the strip-type bonding area 111a of the first pin 111 extends along the first transverse edge 110-1a of the first die paddle 110-1, while the second pin 112 is close to the second transverse edge 110-2b of the second die paddle 110-2 and the strip-type bonding area 112a of the second pin 112 extends along the second transverse edge 110-2a of the second die paddle 110-2. Furthermore, the first row of carrier pins 113 are positioned along the side of the second longitudinal edge 110-1d of the first die paddle 101-1 with each carrier pin of the first row of carrier pins 113 being parallel to the second longitudinal edge 110-1d of the first die paddle 110-1 and longitudinally extending from the first pin 111 to a transverse scribe line 380 between the first die paddle 110-1 and the second die paddle 110-2. The second row of carrier pins 114 are positioned along the side of the second longitudinal edge 110-2d of the second die paddle 110-2 with each carrier pin of the second row of carrier pins 114 being parallel to the second longitudinal edge 110-2d of the second die paddle 110-2 and longitudinally extending from the second pin 112 to the transverse scribe line 380. The first die 101 is attached on the top surface of the first die paddle 110-1 and the second die 102 is attached on the top surface of the second die paddle 110-2, where the third electrodes at the back surfaces of the first die 101 and the second die 102 are directly attached on the top surface of the first die paddle 110-1 and the second die paddle 110-2 respectively, while the control die 103 is flipped and attached on the first row of carrier pins 113 and the second row of carrier pins 114.

As shown in FIG. 7A, the second pin 112 and the innermost carrier pin 114-1 are connected together with a connecting part 115b. Similar to FIG. 2F, each carrier pin of the first row of carrier pins 113 comprises an upper pin 113a and a lower pin 113b and each carrier pin of the second row of carrier pins 114 comprises an upper pin 114a and a lower pin 114b, where the top surfaces of the upper pins 113a and 114a of all carrier pins are coplanar with the front surfaces 101a and 102a of the first die 101 and the second die 102 respectively after the dies are mounted on the first and second die paddles, as shown in FIG. 7B, thus the control die 103 is flipped and attached on the first row of carrier pins 113 and the second row of carrier pins 114 and also is partially overlapped on the first die 101 and the second die 102a with the plurality metal bumps 201 deposited on the plurality of electrode pads at the front surface of the control die 103 at the overlapping area being respectively aligned with and mounted on the first electrode 101a and the second electrode 101b at the front surface of the first die 101 and the first electrode 102a and the second electrode 102b at the front surface of the second die 102. The other metal bumps 201 deposited on the remained electrode pads of the control die 103 are respectively aligned with and electrically connected to each corresponding upper pin of the first row of carrier pins 113 and the second row of carrier pins 114, which is similar as that shown FIG. 2C. However, the control die 103 cannot be contacted with the metal clip 250. In FIGS. 7B-7C, the first electrode 101a of the first die 101 and the first electrode 102a of the second die 102 are electrically connected with the second pin 112 through a metal clip 250 that has a wave shape including a plurality of first parts 250b and 250d (bridge part) and a plurality of second parts 250a, 250c and 250e (valley part), where the plane of the first part 250b or 250d is higher than that of the second part 250a, 250c or 250e. The second parts 250c and 250e of the metal clip 250, which are mounted on the first electrode 101a of the first die 101 and the first electrode 102a of the second die 102, are coplanar, while the second part 250a at one end of the metal clip 250, which is mounted on the second pin 112, is located in a plane lower than that of the second parts 250c and 250e. The first part and the second part are alternatively formed in a metal clip 250 with both sides of each first part being connected with two second parts and vice versa. As shown in FIG. 7C, the second part 250a is mounted on the top surface of the bonding area 112a of the second pin 112 with a conductive adhesive, while the second parts 250c and 250e are mounted on the first electrodes 102a and 102a of the second die 102 and first die 101 respectively with an adhesive.

Figure 7D:
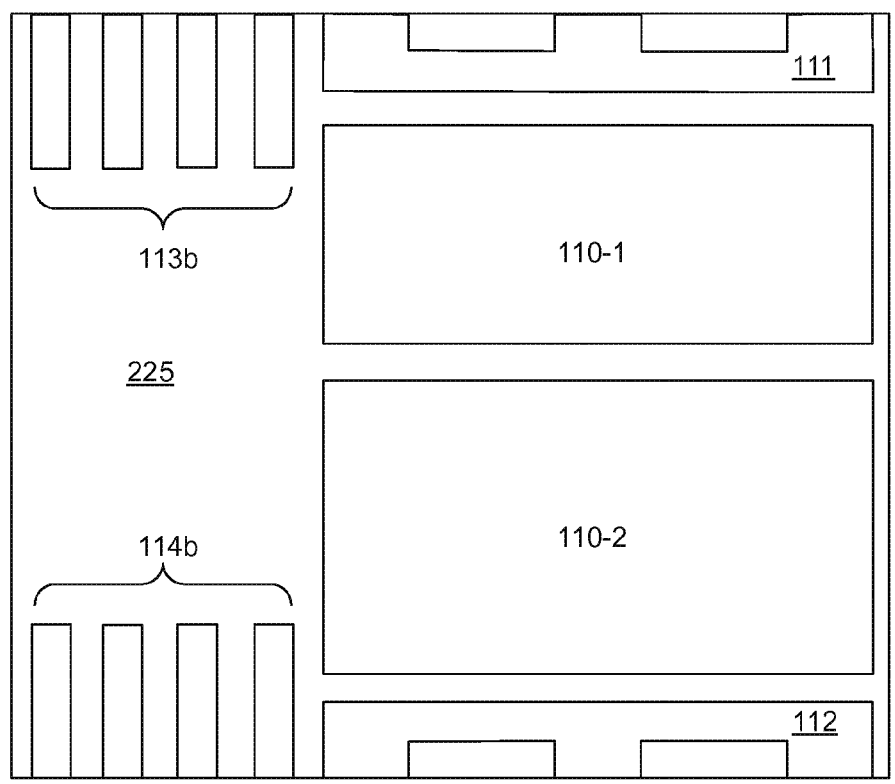

In addition, as shown in FIGS. 7A-7C, the first die paddle 110-1 includes a connecting part 116 extending from the first transverse edge 110-1a of the first die paddle 110-1 to the first pin 111 and connecting to the first pin 111. The connecting part 116 is preferably thinner than the first die paddle 110-1 for clamping with the plastic package body 225. FIG. 7D is a bottom view of the power control device of FIGS. 7A-7C after the packaging process. As shown in FIG. 7D, the power control device further comprises a plastic package body 225 that encapsulates the lead frame unit, the first die 101 and the second die 102, the control die 103, the metal clip 250 and the metal bumps 201 with the bottom surfaces of the lower pins 113b and 114b, the bottom surfaces of the first die paddle 110-1 and the second die paddle 110-2, the bottom surface of the first pin 111 and the second pin 112 being exposed from the bottom surface of the plastic package body 225.

Figure 8A:
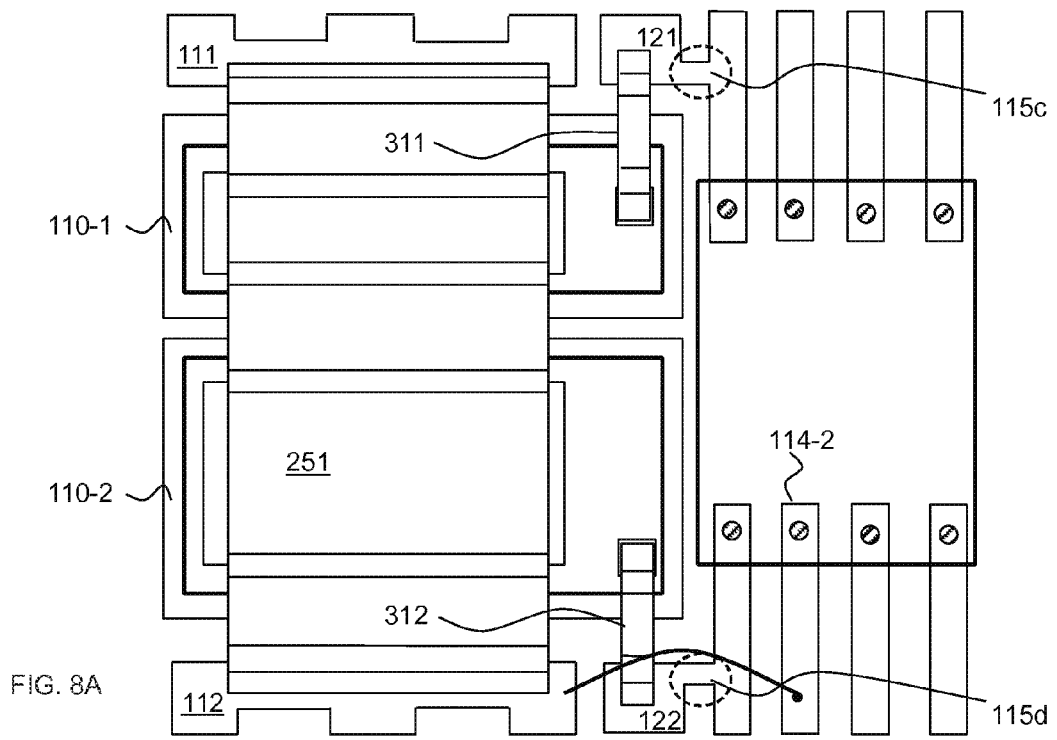
FIG. 8A is a schematic diagram of the power control device with the lead frame comprising two separate die paddles and the bypass pin.

In another embodiment as shown in FIG. 8A, the control die 103 is flipped and attached on the first row of carrier pins 113 and the second row of carrier pins 114, but not overlapped with the first die 101 and the second die 102. The metal bumps 201 formed on the electrode pads at two opposite edges of the control die 103 are respectively aligned with and attached on the corresponding carrier pins of the first row of carrier pins 113 and the second row of carrier pins 114 carrier. The first die paddle 110-1 does not include the connecting part 116 as that shown in FIG. 7A, thus it is separated from the first pin 111. Similar as FIG. 5A, the length of the first pin 111 is less than the length of the first transverse edge 110-1a of the first die paddle 110-1 and the length of the second pin 112 is less than the length of the first transverse edge 110-2b of the second die paddle 110-2. As such, the lead frame unit further includes the first bypass pin 121 positioned between the innermost carrier pin 113-1 of the first row of carrier pins 113 and the first pin 111 close to the first transverse edge 110-1a of the first die paddle 110-1, which includes a connecting part 115c connecting to the carrier pin 113-1. Similarly, the lead frame unit further includes the second bypass pin 122 positioned between the innermost carrier pin 114-1 of the second row of carrier pins 114 and the second pin 112 close to the second transverse edge 110-2b of the second die paddle 110-2, which includes a connecting part 115d connecting to the carrier pin 114-1. The second electrode 101b at the front surface of the first die 101 is electrically connected with the first bypass pin 121 through a conductive structure 311 and the second electrode 102b at the front surface of the second die 102 is electrically connected with the second bypass pin 122 through a conductive structure 312. In this embodiment, the second pin 112 is electrically connected with any carrier pin of the second row of carrier pins 114, excepting the innermost carrier pin 114-1 and preferably the carrier pin 114-2 closer to the second pin 112, via a bonding wire 119. In addition, the first electrodes 101a and 101b at the front surfaces of the first die 101 and the second die 102 are electrically connected with the first pin 111 and the second pin 112 via a metal clip 251 having a wave shape as shown in FIG. 11B, which includes a plurality of first parts 251b, 251d and 251f (bridge part) and a plurality of second parts 251a, 251c, 251e and 251g (valley part), where the plane of each first part is higher than that of each second part and the first part and the second part are alternatively formed in the metal clip 241 with both sides of each first part are connected with two second parts and vice versa. The second parts 251a and 251g at both ends of the metal clip 251 are coplanar and are mounted on the top surfaces of the bonding area 112a of the second pin 112 and the bonding area 111a of the first pin 111 respectively via a conductive adhesive. The second parts 251c and 251e are also coplanar and are mounted on the first electrode 102a of the second die 102 and the first electrode 101a of the first die 101 via an adhesive. The plane of the second parts 251a and 251g is lower than the plane of the second parts 251c and 251e. The power control device further comprises a plastic package body 225 (not shown) encapsulating the lead frame unit, the first die 101 and the second die 102, the control die 103, the metal clip 251, metal bumps 201, the bonding wire 119 and the conductive structures 311 and 312, where the bottom surfaces of lower pins, the bottom surfaces of the first die paddle 110-1 and the second die paddle 110-2, the bottom surface of the first pin 111 and the second pin 112, and the bottom surfaces of the first bypass pin 121 and the second bypass pin 122 are exposed from the bottom surface of the plastic package body 225, while the first die 101 and the second die 102, the control die 103, the metal clip 251, the bonding wire 119 and the conductive structures 311 and 312 are completely encapsulated by the plastic package body 225.

Figure 8B:
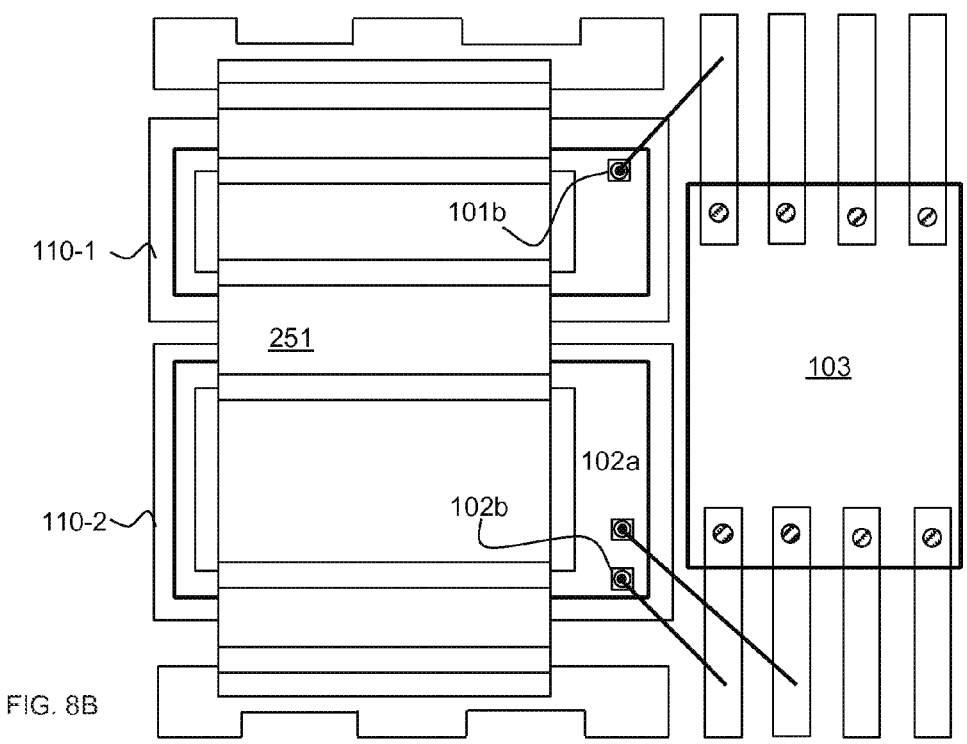
FIG. 8B is a schematic diagram of the power control device having two separate die paddles and the bonding wire.

FIG. 8B shows an alternative power device similar as that of FIG. 8A excepting that the lead frame does not include the first bypass pin 121 and the second bypass pin 122, the connecting parts 115c and 115d and the conductive structures 311 and 312. As such, the second electrode 101b at the front surface of the first die 101 is electrically connected with any carrier pin of the first row of carrier pins 113 via a bonding wire 119, preferably with the innermost carrier pin 113-1 for a shortest bonding wire 119. Similarly, the second electrode 102b at the front surface of the second die 102 is electrically connected with any carrier pin of the second row of carrier pins 114 and the first electrode 102a of the second die 102 is electrically with any carrier pins of the second row of carrier pins 114 that are not connected with the second electrode 102b via the bonding wire 119, for example, the second electrode 102b is electrically connected with the innermost carrier pin 114-1 and the first electrode 112a is electrically connected with the carrier pin 114-2 closest to the carrier pin 114-1 carrier, thus the length of bonding wire 119 is optimized. The power control device further comprises a plastic package body 225 (not shown) covering the lead frame unit, the first die 101 and the second die 102, the control die 103, the metal clip 251, the metal bumps 201, and the bonding wires 119, where the bottom surfaces of lower pins, the bottom surfaces of the first die paddle 110-1 and the second die paddle 110-2, the bottom surface of the first pin 111 and the second pin 112 are exposed from the bottom surface of the plastic package body 225, while the first die 101 and the second die 102, the control die 103, the metal sheet 251, the bonding wire 119 and the metal bumps 201 are completely encapsulated by the plastic package body 225.

Figure 8C:
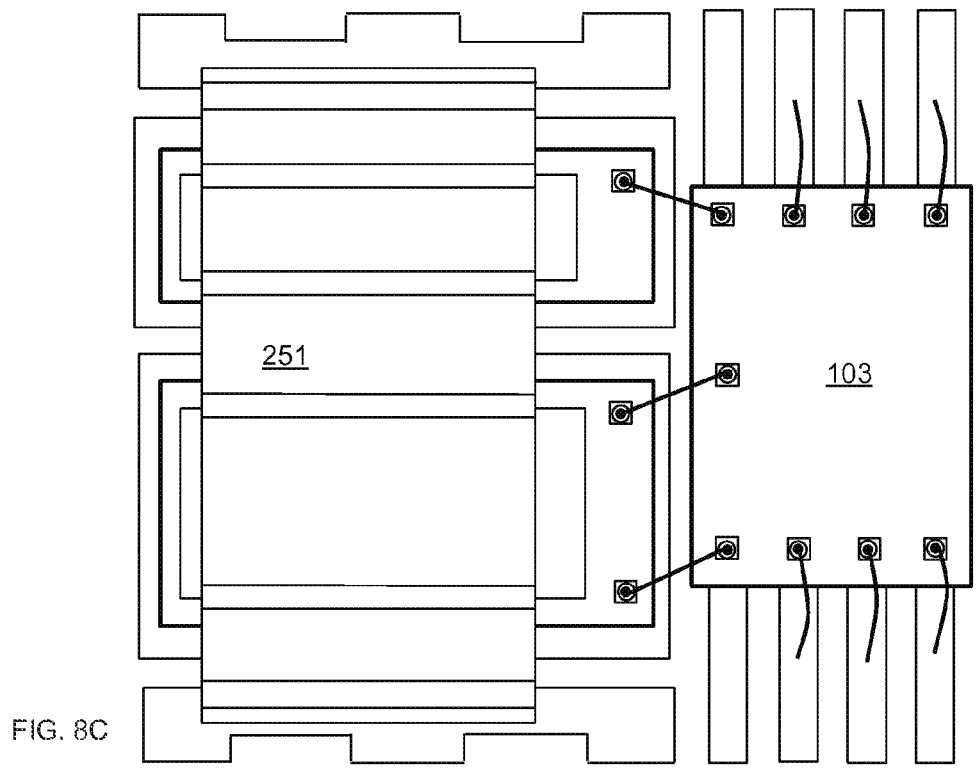
FIG. 8C is a schematic diagram of the power control device having two separate die paddles and non-flipped control die.

In another embodiment shown in FIG. 8C, the structure of the power device is similar as that shown in FIG. 8B excepting that the control die 103 is mounted on the first row of carrier pins 113 and the second row of carrier pins 114 without flipping, where the back surface of the control die 103 is directly attached on the first row of carrier pins 113 and the second row of carrier pins 114 through a non-conductive adhesive. The second electrode 101b at the front surface of the first die 101 and the first electrode 102a and the second electrode 102b of the second die 102 are electrically connected with the corresponding electrode pads 103a, without the metal bumps formed on top of the electrode pads, formed at the front surface of the control die 103 with bonding wires 119. The other electrode pads 103a on the control die 103, excepting the electrode pads connected to the second electrode 101b and 102b and the first electrode 102a, positioned at two opposite edges of the control die 103 are electrically connected with the carrier pins of the first row of carrier pin 113 and the second row of carrier pin 114. The electrode pads 103a for connecting with the second electrodes 101b and 102b and the first electrode 102b are positioned close to the die paddle 110-1 and 110-2 for shortest bonding wires 119. The power control device further comprises a plastic package body 225 (not shown) that covers the lead frame unit, the first die 101 and the second die 102, the control die 103, the metal clip 251 and the bonding wire 119 with the bottom surfaces of lower pins, the bottom surfaces of the first die paddle 110-1 and the second die paddle 110-2, the bottom surface of the first pin 111 and the second pin 112 being exposed from the bottom surface of the plastic package body 225, while the first die 101 and the second die 102, the control die 103, the metal clip 251 and the bonding wire 119 are completely encapsulated by the plastic package body 225.

In the embodiments shown in FIGS. 7B, 8A-8C, the first die 101 is an N-type channel MOSFET with top source and bottom drain, while the second die 102 is an N-type channel MOSFET with top drain and bottom source. The first electrode 101a of the first die 101 is the source electrode and the second electrode 101b is the gate electrode. The third electrode at the back surface of the first die is the drain electrode formed by a metal layer (not shown). The first electrode 102a of the second die 102 is the drain electrode and the second electrode 102b is the gate electrode. The third electrode at the back surface of the second die 102 is the source electrode formed by a metal layer.

Figure 9A:
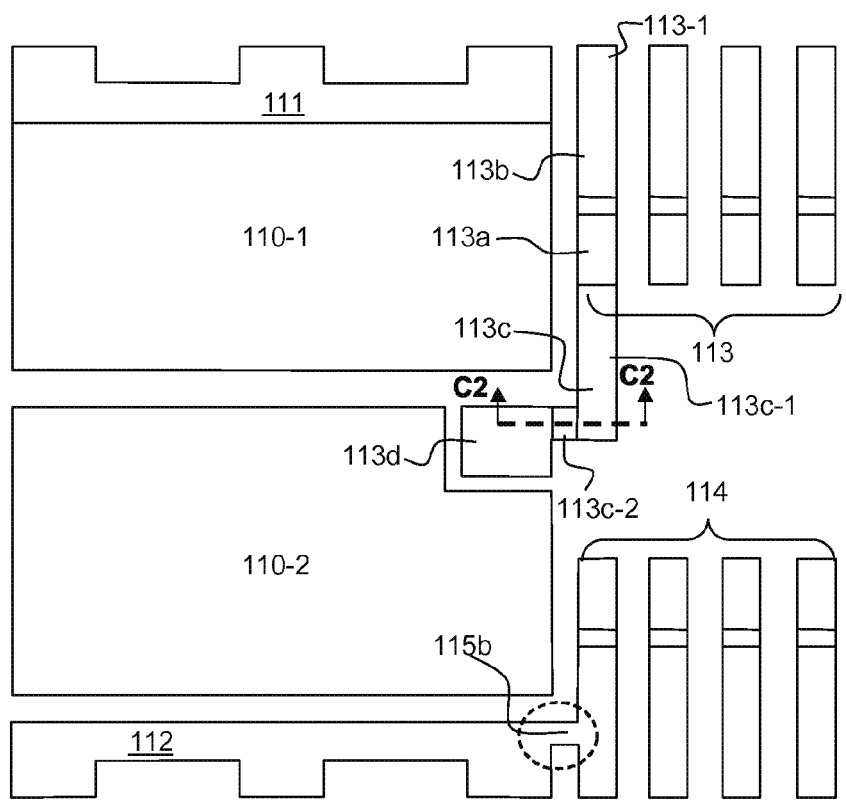
FIGS. 9A-9G are schematic diagrams illustrating a process forming the power control device with the lead frame unit comprising one die paddle and non-flipped low-side MOSFET.
Figure 9B:
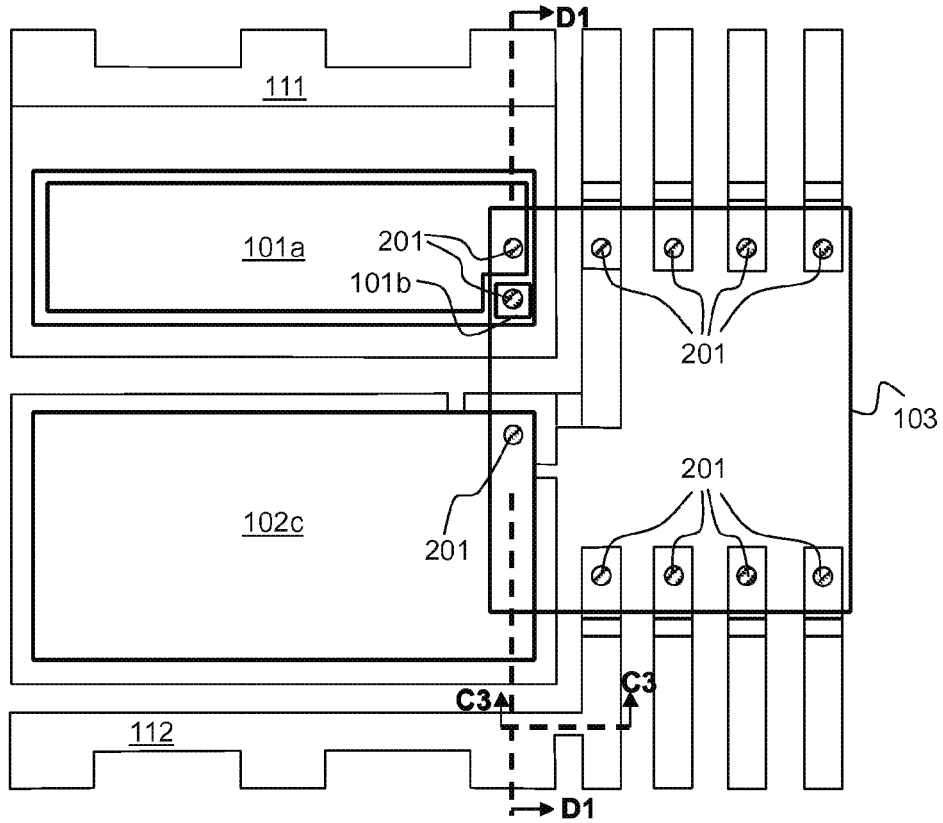
Figure 9C:
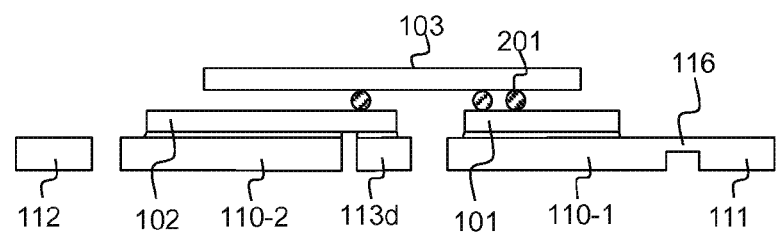
Figure 9D:
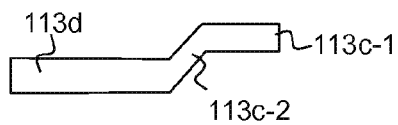
Figure 9E:
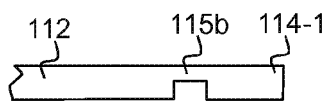

The lead frame unit as shown in FIG. 9A is similar as that shown in FIG. 7A, excepting that the second die paddle 110-2 includes a rectangular notch at the corner of the first transverse edge 110-2a and the second longitudinal edge 110-2d and an island pad 113d is formed in the notch. The lead frame unit further comprises a connecting structure 113c comprising a longitudinal section 113c-1 parallel to the second longitudinal edges 110-1d and 110-2d and a transverse section 113c-2 perpendicular to the longitudinal section 113c-1, with the longitudinal section 113c-1 abutted on the upper part of any carrier pin of the first row of the carrier pins 113 and the second row of the carrier pins 114 excepting the innermost carrier pin 114-1 of the second row of carrier pins 114 that is connected to the second pin 112. Preferably, one end of the longitudinal section 113c-1 is abutted with one end of the upper pin 113a of the innermost carrier pin 113-1 close to the second longitudinal edge 110-1d and both of the longitudinal section 113c-1 and the carrier pin 113-1 are coplanar. The transverse section 113c-2 of the connecting structure 113c and the horizontal plane of the island pad 113d forms an angle with one end of the transverse section 113c-2 connected with the longitudinal section 113c-1 and the other end connected with the island pad 113d as shown in FIG. 9D that is a cross section schematic diagram along the dotted line C2-C2 in FIG. 9A. Thus, the longitudinal section 113c-1 and the transverse section 113c-2 are not coplanar, where the transverse section 113c-2 is bent downward between the plane of the upper pin of the carrier pin and the plane of the island pad 113b. In addition, the second pin 112 includes a connecting part 115b, which is described above in FIG. 7A, for connecting the second pin 112 with the innermost carrier pin 114-1 the second row of carrier pins 114. Generally, the connecting part 115b is thinner than that the second pin 112 as shown in FIG. 9E that is the cross sectional schematic diagram along the dotted line C3-C3 in FIG. 9B. Alternatively, the connecting part 115b may have the same thickness as the second pin 112 and the carrier pin 114-1. As shown in FIG. 9B, the first die 101 is attached on the first die paddle 110-1, so that the third electrode at the back surface thereof is directly attached on the top surface of the first die paddle 110-1. The second die 102 is flipped and attached on the second die paddle 110-2 and the island pad 113d, so that the first electrode 101a is attached on the top surface of the second die paddle 110-2 and the second electrode 102b is attached on the top surface of the island pad 113d; thus, the front surface of the first die 101 and the back surface of the second die 102 are coplanar with the top surfaces of the upper pins 113a and 114a of all carrier pins, such as the control die 103 is flipped and mounted on the first row of carrier pins 113 and the second row of carrier pins 114 and also partially overlapped on the first die 101 and the second die 102. Metal bumps 201 are deposited on the electrode pads formed at the front surface of the control die 103 close to opposite edges and are aligned with and attached to the corresponding upper pins 113a, 114a of the first row of carrier pins 113 and the second row of carrier pins 114. In the overlapping part of the control die 103 and the first die 101 and the second die 102, the metal bumps 201 arranged on the plurality of pads arranged at the front surface at the overlapping part and positioned close to an edge of the control die 103 are respectively aligned with and attached on the first electrode 101a and the second electrode 101b of the first die 101 and the third electrode 102c at the back surface of the second die 102 as shown FIG. 9C that is the cross sectional schematic diagram along the line D1-D2 in FIG. 9B.

Figure 9F:
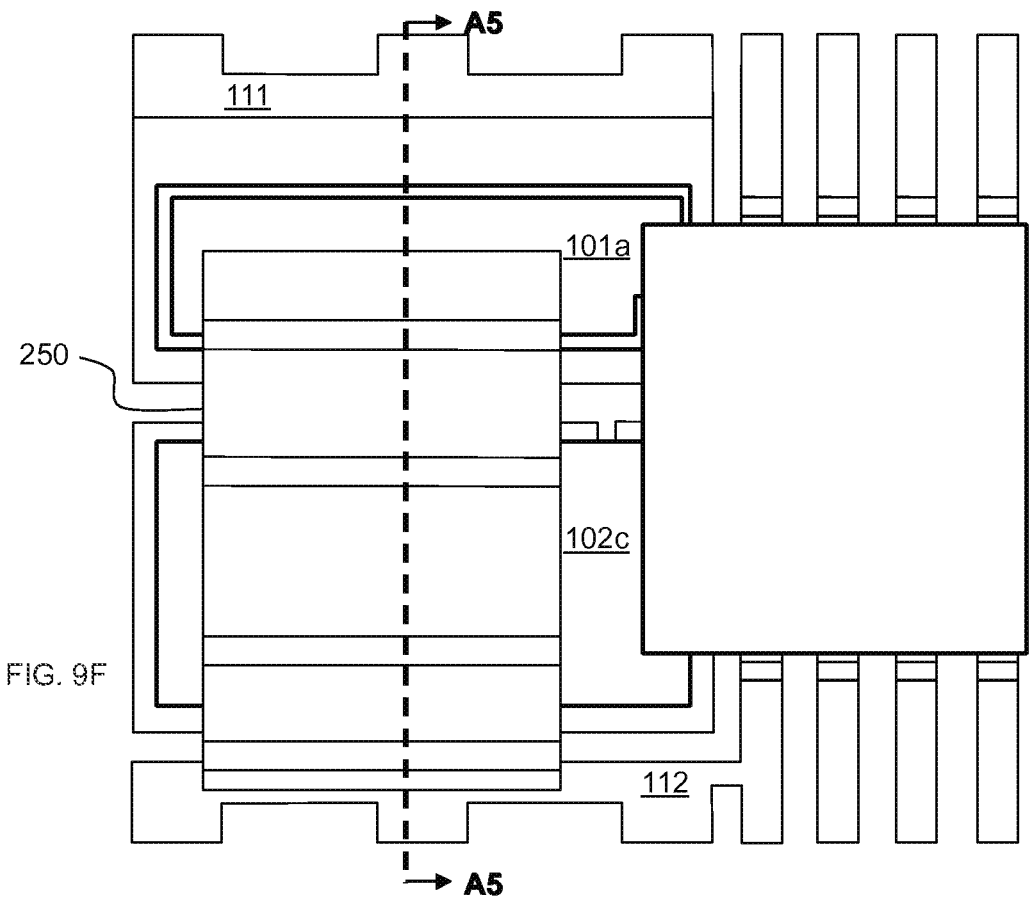
Figure 9G:
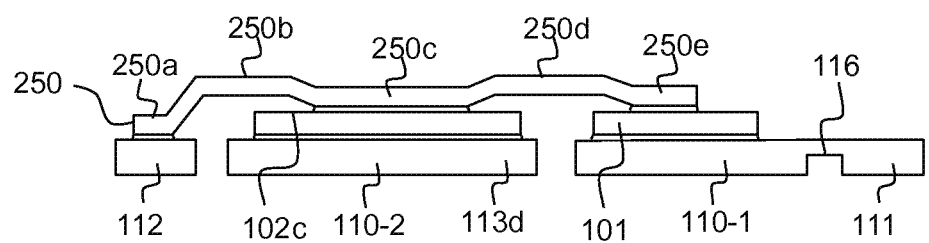

In FIGS. 9F-9G, the first electrode 101a of the first die 101 and the third electrode 102c of the second die 102 are electrically connected with the second pin 112 with the metal clip 250 as described above. However, in this embodiment, the second part 250a is mounted on the top surface of the bonding area 112a of the second pin 112 through a conductive adhesive, while the second part 250c is mounted on the third electrode 102C of the second die 102 through the an adhesive, which is different from the device structure of FIGS. 7B-7C, and the second part 250e is mounted on the first electrode 101a of the first die 101 through an adhesive. The power control device further comprises a plastic package body 225 (not shown) that covers the lead frame unit, the first die 101 and the second die 102, the control die 103, the metal clip 250 and metal bumps 201, with the bottom surfaces of the lower pins 113b and 114b, the bottom surfaces of the first die paddle 110-1 and the second die paddle 110-2, the bottom surface of the first pin 111 and the second pin 112 and the bottom surface of the island pad 113d being exposed from the bottom surface of the plastic package body 225.

Figure 10A:
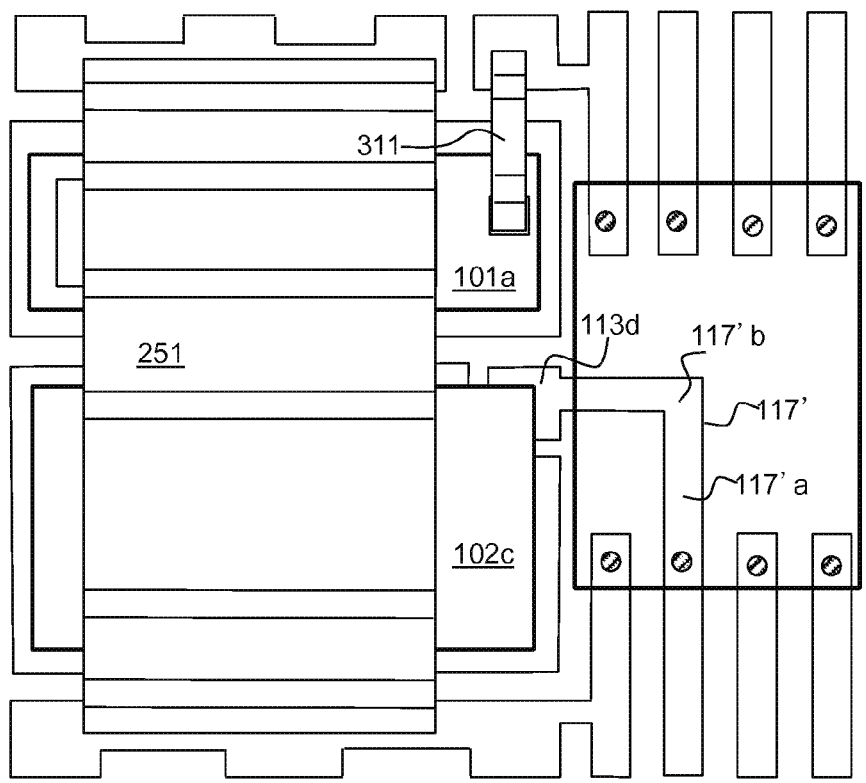
FIG. 10A is a schematic diagram of the power control device including flipped low-side MOSFET and the lead frame unit comprising the bypass pin.

The power device shown in FIG. 10A is similar as that shown in FIG. 9A excepting that the length of the first pin 111 extending along the first transverse edge 110-1a of the first die paddle 110-1 is smaller than that of the first transverse edge 110-1a, and thus the first bypass pin 121 is formed adjacent to the first transverse edge 110-1a of the first die paddle 110-1 and positioned between the innermost carrier pin 113-1 of the first row of carrier pins 113 and the first pin 111, which is similar as that shown in FIG. 5A. The first bypass pin 121 includes a connecting part 115c for connecting the bypass pin 121 with the innermost carrier pin 113-1. The second electrode 101b at the front surface of the first die 101 is electrically connected with the first bypass pin 121 through the conductive structure 311. Each carrier pin of both the first row of carrier pins 113 and the second row of carrier pins 114 has strip shape. In addition, the island pad 113 is mechanically and electrically connected with any carrier pin of the first row of carrier pins 113 and the second row of carrier pins 114, excepting the innermost carrier pins 113-1 and 114-1, by a L-shaped connecting structure 117' including a transverse section 117'b connecting to a longitudinal section 117'a. For example, in FIG. 10A, one end of a transverse section 117'b is connected with the island 113d and one end of the longitudinal section 117'a is abutted with one end of the carrier pin 114-2. Generally, the connecting structure 117' is thinner than the island pad 113 and the carrier pins; thus, the connecting structure 117' is covered by the plastic package body 225 after completing the plastic packaging process. Alternatively, the connecting structure 117' may have the same thickness as the island pad 113 and the carrier pins; thus the bottom surface of the connecting structure 117' is also exposed from the bottom surface of the plastic package body 225 (not shown). In addition, both the first electrode 101a of the first die 101 and the third electrode 102c of the second die 102 are electrically connected with the first pin 111 and the second pin 112 through the metal clip 251 as described above. In FIG. 10A, the second part 251a is attached on the top surface of the bonding area 112a of the second pin 112 through a conductive adhesive, while the second part 251c is attached on the third electrode 102c of the second die 102 through an adhesive, the second part 250e is attached on the first electrode 101a of the first die 101 through an adhesive, and the second part 251g is attached on the top surface of the bonding area 111a of the first pin 111 through a conductive adhesive. The power control device further comprises a plastic package body 225 (not shown) that covers the lead frame unit, the first die 101 and the second die 102, the control die 103, the metal clip 251 and the conductive structure 311, metal bumps 201, the island pad 113d and the first bypass pin 121, with the bottom surfaces of the carrier pins, the bottom surfaces of the first die paddle 110-1 and the second die paddle 110-2, the respective bottom surface of the first pin 111 and the second pin 112, the bottom surface of the island pad 113d and the bottom surface of the first bypass pin 121 exposed from the bottom surface of the plastic package body 225.

Figure 10B:
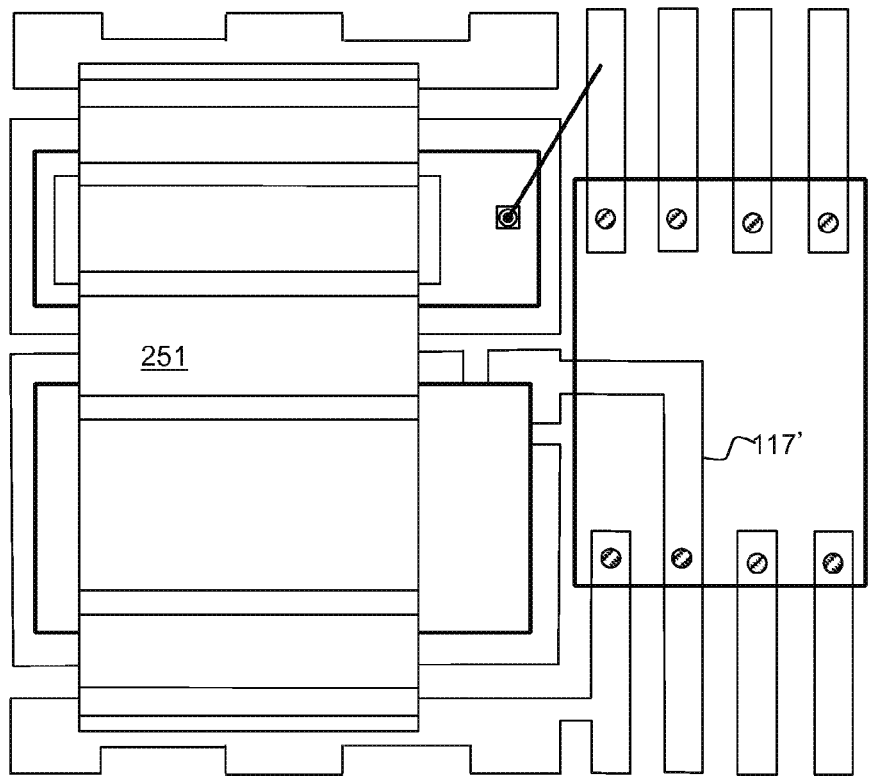
FIG. 10B is a schematic diagram of the power control device including flipped low-side MOSFET and the bonding wire.

FIG. 10B is a top view of an alternative power device that is similar to that of FIG. 10A excepting that the second electrode 101b at the front surface of the first die 101 is electrically connected with any carrier pin of the first row of carrier pins 113 via a bonding wire 119, preferably the innermost carrier pin 113-1 for a shortest bonding wire 119, as such the bypass pin 121 and the conductive structure 311 are omitted. As a result, the plastic package body 225 (not shown) also covers the bonding wire 119.

Figure 11A:
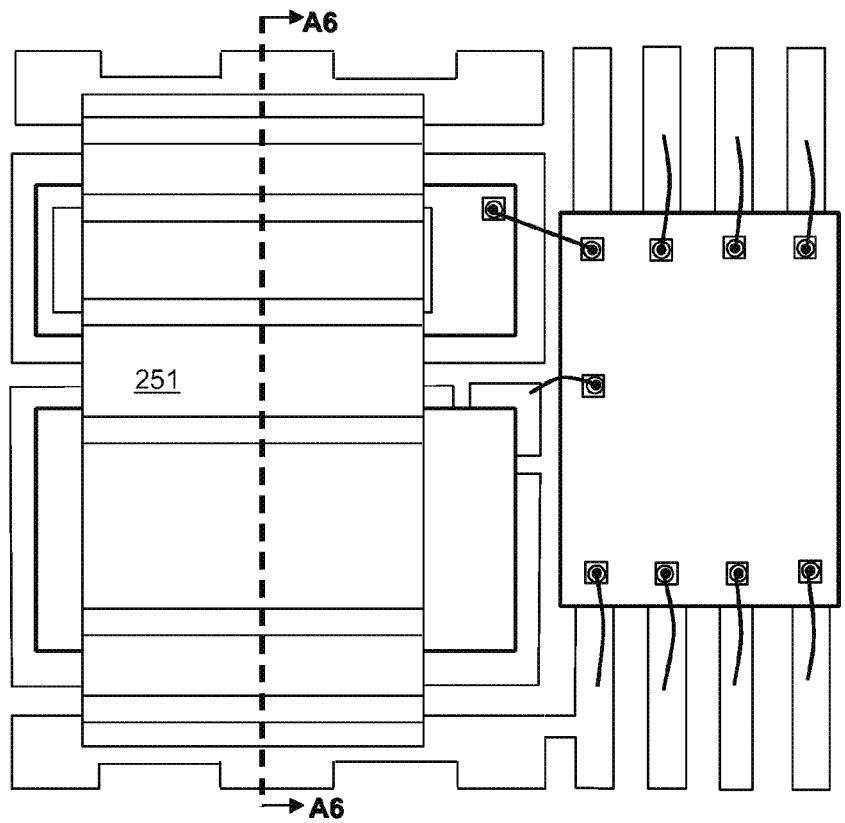
FIGS. 11A-11B are schematic diagrams of the power control device including flipped low-side MOSFET and non-flipped control die.
Figure 11B:
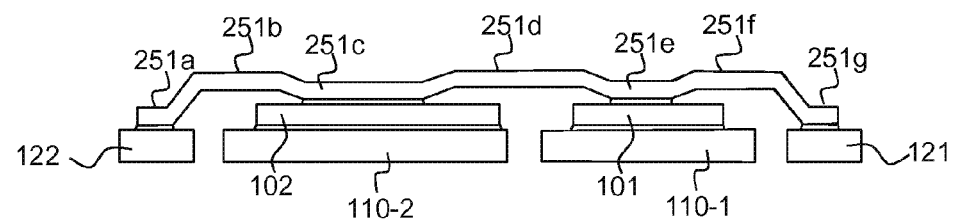

FIG. 11A is a top view of another alternative power device that is similar to that of FIG. 10B excepting that the control die 103 is mounted on the first row of carrier pins 113 and the second row of carrier pins 114 via a non-conductive adhesive without flipping, thus the connecting structure 117' is omitted. The second electrode 101b of the first die 101 and the island pad 113d are electrically connected with the corresponding electrode pads 103a at the front surface of the control die 103 through the bonding wires 119, preferably, the pads 103a positioned close to the first and second die paddles 110-1 and 110-2 for shortest bonding wires 119. In addition, the other electrode pads 103a, which are not connected with the second electrode 101b and the island pad 113d, positioned close to two opposite edges of the control die 103 are electrically connected with the carrier pins of the first row of carrier pins 113 and the second row of carrier pins 114 through the bonding wires 119. As shown in FIG. 11B, which is a cross sectional schematic diagram of the device of FIG. 11A along the lined A6-A6, the second part 251a is attached on the top surface of the bonding area 112a of the second pin 112 through a conductive adhesive, while the second part 251c is attached on the third electrode 102c of the second die 102 through an adhesive (since the second die 102 is flipped), the second part 250e is attached on the first electrode 101a of the first die 101 through an adhesive, and the second part 251g is attached on the top surface of the bonding area 111a of the first pin 111 through a conductive adhesive. The power control device further comprises a plastic package body 225 (not shown) that covers the lead frame unit, the first die 101 and the second die 102, the control die 103, the metal clip 251 and bonding wires 119 with the bottom surfaces of the carrier pins, the bottom surfaces of the first die paddle 110-1 and the second die paddle 110-2, the respective bottom surface of the first pin 111 and the second pin 112 and the bottom surface of the island pad 113d exposed from the bottom surface of the plastic package body 225.

In the embodiments shown in FIGS. 9B, 10A-10B and 11A, the first die 101 is an N channel-type MOSFET and the second die 102 is an N channel-type MOSFET. The first electrode 101a of the first die 101 is the source electrode and the second electrode 101b is the gate electrode. The third electrode at the back surface of the first die is the drain electrode formed by a metal layer. Similarly, the first electrode 102a of the second die 102 is the source electrode and the second electrode 102b is the gate electrode. The third electrode at the back surface of the second die 102 is the drain electrode formed by a layer.

The above detailed descriptions are provided to illustrate specific embodiments of the present invention and are not intended to be limiting. Numerous modifications and variations within the scope of the present invention are possible. The present invention is defined by the appended claims.

The invention claimed is:

1. A power semiconductor device comprising:
a lead frame unit, a control die, a first die and a second die, and a metal clip
wherein
the lead frame unit comprises a first die paddle and a second die paddle disposed side by side adjacent but separated from each other, a first pin and a first row of carrier pins adjacent to the first die paddle and a second pin and a second row of carrier pins adjacent to the second die paddle;
the first and second die paddles each comprises respectively a first transverse edge and a second transverse edge opposite to the first transverse edge, a first longitudinal edge and a second longitudinal edge opposite to the first longitudinal edge, wherein the first pin comprises a bonding area adjacent to and extending along the first transverse edge of the first die paddle, and the second pin comprising a bonding area adjacent to and extending along the second transverse edge of the second die paddle;
both of the first row of carrier pins and the second row of carrier pins are positioned at one side of the second longitudinal edges of the first and second die paddles away from the first longitudinal edges, each carrier pin of the first row of carrier pins is substantially parallel to each other and extends from an extension line of the first pin towards a center line between the first transverse edge of the first die paddle and the second transverse edge of the second die paddle, and each carrier pin of the second row of carrier pins is substantially parallel to each other and extends from an extension line of the second pin towards the center line;
each of the first die and the second die has a back surface attached onto the first and second die paddles respectively and the control die is attached onto the first row of carrier pins and the second row of carrier pins, wherein the metal clip electrically connects a first electrode at a front surface opposite to the back surface of the first die and a first electrode at a front surface opposite to the back surface of the second die to the second pin.

2. The power semiconductor device of claim 1, wherein the second pin connects with an innermost carrier pin of the second row of carrier pins through a connecting part extending from the second pin;
each carrier pin of the first row of carrier pins and the second row of carrier pins comprises an upper pin and a lower pin connected together, wherein top surfaces of the upper pins of all carrier pins are substantially coplanar with the front surfaces of the first die and the second die;
wherein the control die is flipped and attached on the first row of carrier pins and the second row of carrier pins and partially overlaps the first die and the second die so that a plurality of metal bumps formed on a plurality of electrode pads at a front surface of the control die are respectively aligned with and electrically connected with a second electrode at the front surface of the first die and a second electrode at the front surface of the second die;
the metal bumps formed on other electrode pads at the front surface of the control die are respectively aligned with and electrically connected with corresponding upper pins of the carrier pins of the first row of carrier pins and the second row of carrier pins.

3. The power semiconductor device of claim 2, wherein the first die paddle comprises a connecting part connecting the first die paddle at the first transverses edge to the first pin.

4. The power semiconductor device of claim 1, wherein the control die is flipped and attached on the first row of carrier pins and the second row of carrier pins, and metal bumps formed on respective electrode pads at the front surface of the control die thereof are respectively aligned with and electrically connected with the corresponding carrier pins, the metal clip further connected to the first pin.

5. The power semiconductor device of claim 4, wherein a length of the first pin extending along the first transverse edge of the first die paddle is less than a length of the first transverse edge of the first die paddle, and a length of the second pin extending along the second transverse edge of the second die paddle is less than a length of the second transverse edge of the second die paddle;

the lead frame unit comprises a first bypass pin positioned between the first pin and an innermost carrier pin of the first row of carrier pins close to the first transverse edge of the first die paddle, the first bypass pin connected with the innermost carrier pin of the first row of carrier pins through a connecting part;

the lead frame unit also comprises a second bypass pin positioned between the second pin and the innermost carrier pin of the second row of carrier pins close to the second transverse edge of the second die paddle, the second bypass pin connected with the innermost carrier pin of the second row of carrier pins through a connecting part;

second electrodes at the front surface of the first die and the second die are electrically connected with the first bypass pin and the second bypass pin through metal conductors respectively;

wherein the lead frame unit also comprises a plurality of bond wires electrically connecting the second pin or the first electrode on the front surface of the second die to a carrier pin of the second row of carrier pins other than the innermost carrier pin of the second row of the carrier pins.

6. The power semiconductor device of claim 4 further comprising a plurality of bonding wires electrically connecting the second electrode at the front surface of the first die to a carrier pin of the first row of carrier pins and the second electrode at the front surface of the second die to a carrier pin of the second row of carrier pins respectively.

7. The power semiconductor device of claim 1, wherein a back surface of the control die is attached on the first row and the second row of carrier pins;

wherein the power semiconductor device further comprises a plurality of bonding wires electrically connecting a second electrode at the respective front surfaces of the first die and the second die to corresponding electrode pads at a front surface of the control die respectively and electrically connecting electrode pads at the front surface of the control die not connected to the second electrodes at the respective front surfaces of the first die and the second die to corresponding carrier pins of the first row and the second row of carrier pins respectively.

8. A power semiconductor device comprising:

a lead frame unit, a control die, a first die and a second die, and a metal clip wherein the lead frame unit comprises a first die paddle and a second die paddle disposed side by side adjacent but separated from each other, a first pin and a first row of carrier pins adjacent to the first die paddle and a second pin and a second row of carrier pins adjacent to the second die paddle;

the first and second die paddles each comprises respectively a first transverse edge and a second transverse edge opposite to the first transverse edge, a first longitudinal edge and a second longitudinal edge opposite to the first longitudinal edge, wherein the first pin comprises a bonding area adjacent to and extending along the first transverse edge of the first die paddle, and the second pin comprising a bonding area adjacent to and extending along the second transverse edge of the second die paddle;

both of the first row of carrier pins and the second row of carrier pins are positioned at one side of the second longitudinal edges of the first and second die paddles away from the first longitudinal edges, each carrier pin of the first row of carrier pins is substantially parallel to each other and extends from an extension line of the first pin towards a center line between the first transverse edge of the first die paddle and the second transverse edge of the second die paddle, and each carrier pin of the second row of carrier pins is substantially parallel to each other and extends from an extension line of the second pin towards the center line;

wherein a corner at the first transverse edge and the second longitudinal edge of the second die paddle is separated from the second die paddle to form an island thus providing an L shape second die paddle;

the first die having a third electrode at a back surface attached onto the first die paddle and the second die has a first and second electrodes on its front surface flip-chip mounted onto the second die paddle and the island respectively and the control die is attached onto the first row of carrier pins and the second row of carrier pins, wherein the metal clip electrically connects a first electrode at a front surface opposite to the back surface of the first die and a third electrode at a back surface opposite to the front surface of the second die to the second pin.

9. The power semiconductor device of claim 8, wherein the first die paddle comprises a connecting part connecting the first die paddle at the first transverses edge to the first pin.

10. The power semiconductor device of claim 8, wherein each carrier pin of the first row of carrier pins and the second row of carrier pins comprises an upper pin and a lower pin connected together, wherein top surfaces of the upper pins of all carrier pins are substantially coplanar with the front surfaces of the first die and the second die; a connection structure electrically connecting the island to a carrier pin of the first and second row of the carrier pins other than the innermost carrier pin of the second row of carrier pins;

wherein the control die is flipped and attached on the first row of carrier pins and the second row of carrier pins and partially overlaps the first die and the second die so that a plurality of metal bumps formed on a plurality of electrode pads at a front surface of the control die are respectively aligned with and electrically connected with a second electrode at the front surface of the first die and a second electrode at the front surface of the second die;

the metal bumps formed on other electrode pads at the front surface of the control die are respectively aligned with and electrically connected with corresponding upper pins of the carrier pins of the first row of carrier pins and the second row of carrier pins.

11. The power semiconductor device of claim 8, wherein a length of the first pin extending along the first transverse edge is less than a length of the first transverse edge;

the lead frame unit comprises a first bypass pin positioned between the first pin and an innermost carrier pin of the first row of carrier pins close to the first transverse edge, the first bypass pin connected with the innermost carrier pin of the first row of carrier pins through a connecting part;

wherein the lead frame unit further comprises an L-shaped connecting structure having one end abutted with a carrier pin of the first row of carrier pins or the second row of carrier pins other than the innermost carrier pins of the first and second row of the carrier pins and the other end connected with the island; wherein the control die is flipped and attached on the first row of carrier pins and the second row of carrier pins, and metal bumps formed on respective electrode pads at the front surface of the control die thereof are respectively aligned with and electrically connected with the corresponding carrier pins.

12. The power semiconductor device of claim 8, wherein the control die is flipped and attached on the first row of carrier pins and the second row of carrier pins, a bond wire electrically connecting the second electrode on a front surface of the first die to a carrier pin of the first row of carrier pins; wherein the lead frame unit further comprises an L-shaped connecting structure having one end abutted with a carrier pin of the first row of carrier pins or the second row of carrier pins other than the innermost carrier pin of the second row of the carrier pins nor the carrier pin of the first row of the carrier pins connected to the second electrode of the first die and the other end connected with the island.

13. The power semiconductor device of claim 8, wherein a back surface of the control die is attached on the first row and the second row of carrier pins;

wherein the power semiconductor device further comprises a plurality of bonding wires electrically connecting a second electrode at the front surface of the first die and the island to corresponding electrode pads at a front surface of the control die respectively and electrically connecting other electrode pads at the front surface of the control die to corresponding carrier pins of the first row and the second row of carrier pins respectively.

* * * * *